(12) United States Patent
Gottschlich et al.

(10) Patent No.: US 10,922,446 B2
(45) Date of Patent: Feb. 16, 2021

(54) COMPUTATIONAL ACCELERATOR FOR DETERMINATION OF LINKAGES ACROSS DISPARATE WORKS IN MODEL-BASED SYSTEM ENGINEERING

(71) Applicant: Raytheon Company, Waltham, MA (US)

(72) Inventors: Susan N. Gottschlich, Marlborough, MA (US); Gregory S. Schrecke, Upton, MA (US); Patrick M. Killian, N Attleboro, MA (US)

(73) Assignee: Raytheon Company, Waltham, MA (US)

( * ) Notice: Subject to any disclaimer, the term of this patent is extended or adjusted under 35 U.S.C. 154(b) by 594 days.

(21) Appl. No.: 15/845,469

(22) Filed: Dec. 18, 2017

(65) Prior Publication Data

US 2019/0188336 A1 Jun. 20, 2019

(51) Int. Cl.
*G06F 30/00* (2020.01)
*G06F 16/21* (2019.01)

(52) U.S. Cl.
CPC ............ *G06F 30/00* (2020.01); *G06F 16/211* (2019.01)

(58) Field of Classification Search
CPC ............................. G06F 30/00; G06F 16/211
USPC .......................................................... 703/6
See application file for complete search history.

(56) References Cited

U.S. PATENT DOCUMENTS

| | | | |
|---|---|---|---|
| 8,032,824 B2 | 10/2011 | Croft et al. | |
| 8,300,952 B2 | 10/2012 | Xiao et al. | |
| 8,397,210 B2 | 3/2013 | Dutta et al. | |
| 8,402,030 B1 | 3/2013 | Pyle et al. | |
| 8,527,864 B2 | 9/2013 | Massand | |
| 2003/0216919 A1* | 11/2003 | Roushar | G06F 40/30 704/260 |
| 2009/0222719 A1 | 9/2009 | Croft | |
| 2016/0371251 A1* | 12/2016 | Wang | G06F 3/0237 |

* cited by examiner

*Primary Examiner* — Justin C Mikowski
(74) *Attorney, Agent, or Firm* — Schwegman Lundberg & Woessner, P.A.

(57) ABSTRACT

A computational accelerator for determination of linkages across disparate works in a model-based system engineering (MBSE) regime accesses textual content of MBSE works and performs preprocessing of each MBSE work to produce a preprocessed data structures representing the MBSE works. The preprocessing gatherings significant terms from each MBSE work, and delineates the textual content of each MBSE work into segments corresponding to separately identifiable textual statements. Segment-wise comparison between segment pairings of the preprocessed data structures corresponding to different MBSE works is performed to produce a set of segment-wise comparison results based on terms common to each segment pairing, and statement-wise linkages between statements of the MBSE works are determined based on the set of segment-wise comparison results.

30 Claims, 12 Drawing Sheets

US 10,922,446 B2

COMPUTATIONAL ACCELERATOR FOR DETERMINATION OF LINKAGES ACROSS DISPARATE WORKS IN MODEL-BASED SYSTEM ENGINEERING

FEDERALLY-SPONSORED RESEARCH AND DEVELOPMENT

The invention(s) described herein was made with government support under Contract No. FA8218-15-D-0001 awarded by the Defense Information Systems Agency. The government has certain rights to those invention(s).

TECHNICAL FIELD

Embodiments described herein generally relate to improving the computational performance of data-processing and computational-analysis systems and associated methods and, more particularly, to special-purpose machinery for facilitating model-based system engineering (MBSE) product and project lifecycle management.

BACKGROUND

Model-based systems engineering (MBSE) is the formalized application of modeling to support system requirements, design, analysis, verification and validation activities beginning in the conceptual design phase and continuing throughout development and later life cycle phases. In some cases, MBSE may be relied upon to support a project lifecycle that could last decades or even centuries. A model in the present context refers to a simplified expression of a concept, phenomenon, relationship, structure or system. It may be represented in textual, graphical, mathematical, or physical forms, MBSE emphasizes the use of digital models such as M-CAD, ECAD, SysML and UML, as the record of authority to be managed in a data-rich environment alongside other products such as design requirements databases, system architecture descriptions and diagrams, testing plans and procedures, manufacturing procedures, maintenance procedures, installation procedures, and the like. MBSE enables engineering teams to more readily understand design change impacts, communicate design intent, and analyze a system design throughout the development and deployment lifecycle of products and projects.

One challenge faced by organizations as they implement MBSE is linking related model and document components for a given product or project across a diverse set of document and model types. For instance, each document may be created or managed by different teams of developers, have different terminology referring to a common concept, be created at different times, be subject to revision at different times, and those revisions may need to be propagated throughout an entire set of models and documents associated with the product or project. To date, this has been largely a human resource-intensive task.

BRIEF DESCRIPTION OF THE DRAWINGS

In the drawings, which are not necessarily drawn to scale, like numerals may describe similar components in different views. Like numerals having different letter suffixes may represent different instances of similar components. Some embodiments are illustrated by way of example, and not limitation, in the figures of the accompanying drawings.

DETAILED DESCRIPTION

Figure 1A:
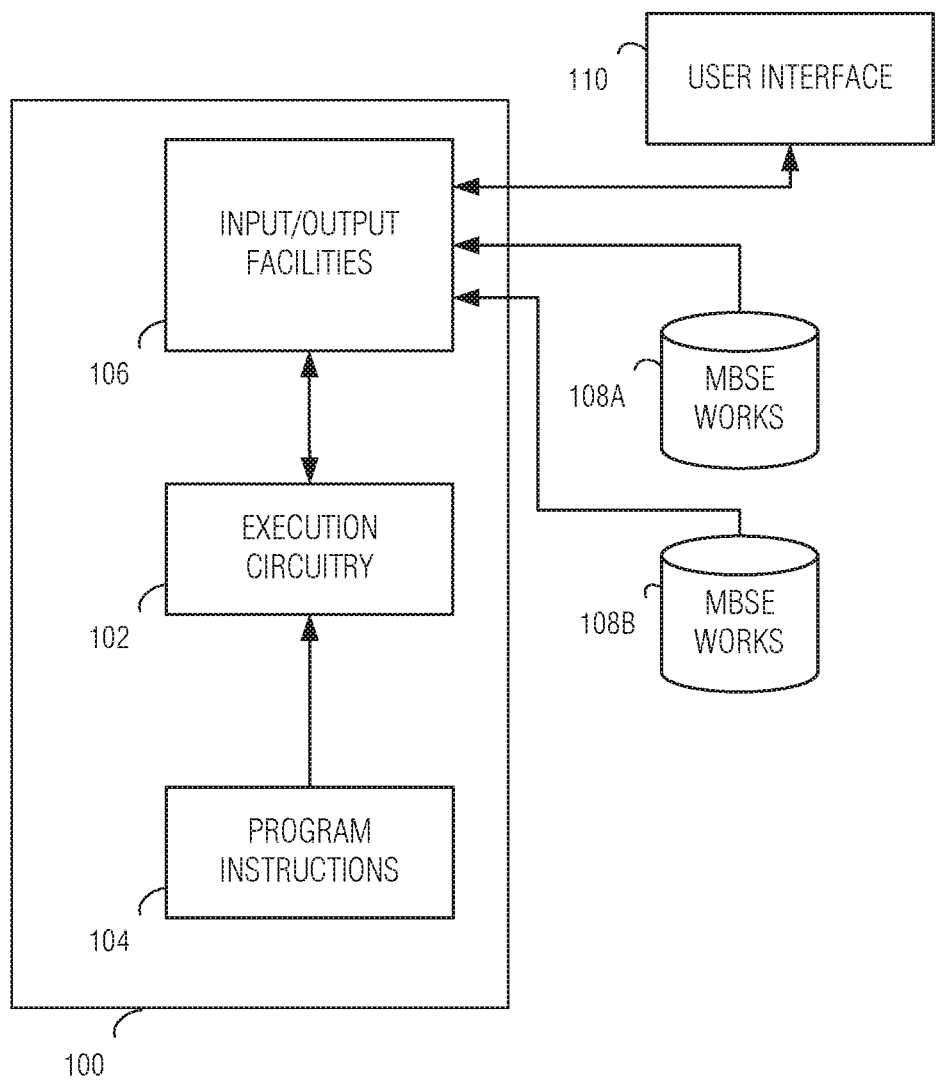
FIG. 1A is a high-level system diagram illustrating a machine implementation according to some embodiments.

Aspects of the embodiments are directed to computationally determining links among and between MBSE work elements over a diverse set of MBSE work types. In the present context, the term MBSE work refers to a digital model, document, database, diagram, procedure, or the like, which is created and managed in connection with a manufactured or produced product or service. Non-limiting examples of products or services include articles of manufacture, prototypes, software products, software-as-a-service, and the like. A project may encompass a set of products or services, including those in their development and deployed phases of lifecycle. Notably, in the development phase of a project. MBSE can provide an important framework for such quality controls as ensuring that design requirements are met, and that the performance and reliability of each use case of product or service is proven through carrying out of a corresponding test case.

In establishing linkages between MBSE works, portions of the MBSE works are compared with one another. Although there are many known techniques for comparing and finding similarity between documents or data objects, automated analysis operations of MBSE works by computational systems present a special set of challenges that make conventional tools unsuitable for linking features or artifacts across various parts of MBSE models, documents, or other artifacts of MBSE works. For example, the types of MBSE works associated with a given product or project may be diverse in terms of content, format, and structure in which various items of information are presented. For instance, design requirement specifications tend to be primarily verbal, whereas other products, such as CAD models, architectural diagrams, and the like, tend to be graphical in nature. Methodologies for relevance scoring of content of the different types of MBSE works would tend to produce vastly different results in terms of semantic representations of these various types due to the variations in their information content volume, structure, and format.

Some embodiments are directed to linking portions of MBSE works at the granularity level of a statement, clause, or provision, of the MBSE works. For the sake of brevity, these types of portions are referred to as statements. A statement is a portion of a MBSE work that is distinctly identifiable within the MBSE work. Given the wide variety of types of MBSE works that may be processed, statements may likewise have substantial variation. Examples of statements include text under a heading or sub-heading, text in a paragraph, text in a sentence, text in a bullet point, text in a table cell, text in a table row, text in a table column, text in a table, text in a figure caption, a textual callout or label of a diagram, a textual name of a component of a CAD model, text appearing as a note, footnote, or comment, or the like.

Related embodiments may examine statements within a single MBSE work (in addition to examining statements across different types of MBSE works) to measure similarity or differences among or between statements to produce a statement-grouping determination. Other related embodiments may select or determine statement-delineation criteria based on a heuristic algorithm that considers document type, structure, and formatting indicia.

One aspect of the embodiments recognizes that a given project or product for which a set of MBSE works are created would tend to use many of the same terms across the multiple MBSE works due to their having common subject matter when analyzed at a high level. The tasks of finding linkages between types of MBSE works (e.g. between architectural features and requirements databases) or even within a single MBSE work (e.g., statements in a requirement database) may be challenging for a number of reasons. For instance, all of the MBSE works are fundamentally related in a defined MBSE environment (e.g. "dismounted situation awareness"). Many of the statements in the MBSE works are quite terse (e.g., simple sentences or even sentence fragments, as contrasted with paragraphs or entire documents). Notably, little useful information can be inferred from the similarity of phrases or words in the MBSE domain, especially across product families. For example, similarity of titles in an architectural feature or verbal phrases in a requirement document may not merit any linkage.

According to some embodiments, a significant-term extraction operation is employed to detect terms in MBSE works that are significant for (a) differentiating statements from one another within individual MBSE works; and (b) determining linkages across multiple MBSE works. Related examples may also use significant terms to determine linkages within the same MBSE work. As between statements of different MBSE works, a comparison utilizing fuzzy logic is performed to produce a fuzzy-match score. The fuzzy-match score may be further compared to a fuzzy threshold and, upon meeting or exceeding the threshold, linkages may be assigned.

Some embodiments perform preprocessing operations prior to the computation of the comparison of statements as between different MBSE works. The preprocessing normalizes statements across diverse types of MBSE works so that links may be identified and scored notwithstanding diverse keyword counts, keyword statistics, grammatical variations, and other properties that vary according to MBSE work type. Variations of statement properties across different types of MBSE works may be substantial. They may result from differences in structure, grammar, verbal quantity, and the like, among the different types of MBSE works. For example, a narrative sentence in one MBSE work may be properly linked to a diagram caption in another MBSE work. In some embodiments, normalization operates to de-emphasize the ordering of terms in phrases, de-emphasize word prefixes and suffixes, and de-emphasize differences between synonyms.

In related embodiments, preprocessing is performed on individual MBSE works before the linkages of statements contained in those works are determined with respect to other MBSE works. One type of preprocessing includes enhancement of statement differentiation to aid in distinguishing one statement from another within the same MBSE work. Statement differentiation may include suppression of high-frequency terms. High-frequency terms are terms, or keywords, that appear frequently throughout a MBSE work. One implementation of high-frequency term suppression utilizes an ignore-term list, which contains a set of terms to be excluded from consideration during statement normalization. Statement-differentiation enhancement may also help to accelerate the computational performance of the system by reducing or eliminating the workload associated with processing the high-frequency terms.

In a related embodiment, the preprocessing operations include application of an include-term list to capture certain important single words, hyphenated terms, or terms containing stop words, which might otherwise be missed by a conventional noun phrase extraction operation. As an example, the include term list may be automatically generated based on a search for regular expression patterns that are associated with certain relevant topics covered by MBSE works.

In another related embodiment, the preprocessing operations include term expansion of each significant term to produce greater set of keywords to be used in the comparison operations. In one example, tokenization is performed to produce a list or other data structure containing individual words associated with each term. In a related embodiment, synonym expansion produces a greater list of keywords. Tokenization and expansion according to these embodiments helps to address the challenge of terseness of some MBSE works, and the linguistic diversity across various MBSE works by increasing the likelihood of detecting matching or similar semantics even in the absence of identical keywords.

Aspects of the embodiments may be implemented as part of a computing platform. FIG. 1A is a high-level system diagram illustrating a machine implementation of a computational accelerator system for determining linkages across a diverse set of works according to some embodiments. Computational accelerator system 100 includes execution circuitry 102, such as one or more processors, memory, system interconnects, and the like, examples of which are described in greater detail below. Program instructions 104 are stored on a tangible, non-transitory, storage medium, such as a memory device, non-volatile memory, hard drive, solid-state drive, or the like, which is interfaced with execution circuitry 102. Input/output facilities 106 are interfaced with execution circuitry 102, and are configured to facilitate the transmission of information from and to computational accelerator system 100.

When executed by the processing circuitry 102, program instructions 104 create a special-purpose machine that embodies computational accelerator system 100. It may be one physical machine, or may be distributed among multiple physical machines, such as by role or function, or by process thread in the case of a cloud computing distributed model. In various embodiments, aspects of the invention may be configured to run in virtual machines that in turn are executed on one or more physical machines. It will be understood by persons of skill in the art that features of the invention may be realized by a variety of different suitable machine implementations.

MBSE works 108A and 108B are each stored in a respective tangible storage medium as a file, collection of files, database, or other data structure, and accessible by system 100 via input/output facilities 106. User interface 110 is also interfaced with system 100 via input/output facilities 106. User interface 110 may be hosted on the same machine as system 100, or it may be hosted on a remote device that is communicatively coupled to system 100 via a data-communication network. In various embodiments, system 100 reads MBSE works 108A, 108B, processes their contents to determine linkages between them, and presents the determinations to user interface 110. The determinations of linkages may be presented as computed assessments, or as computed recommendations, with the latter being subject to review and approval by a user.

Figure 1B:
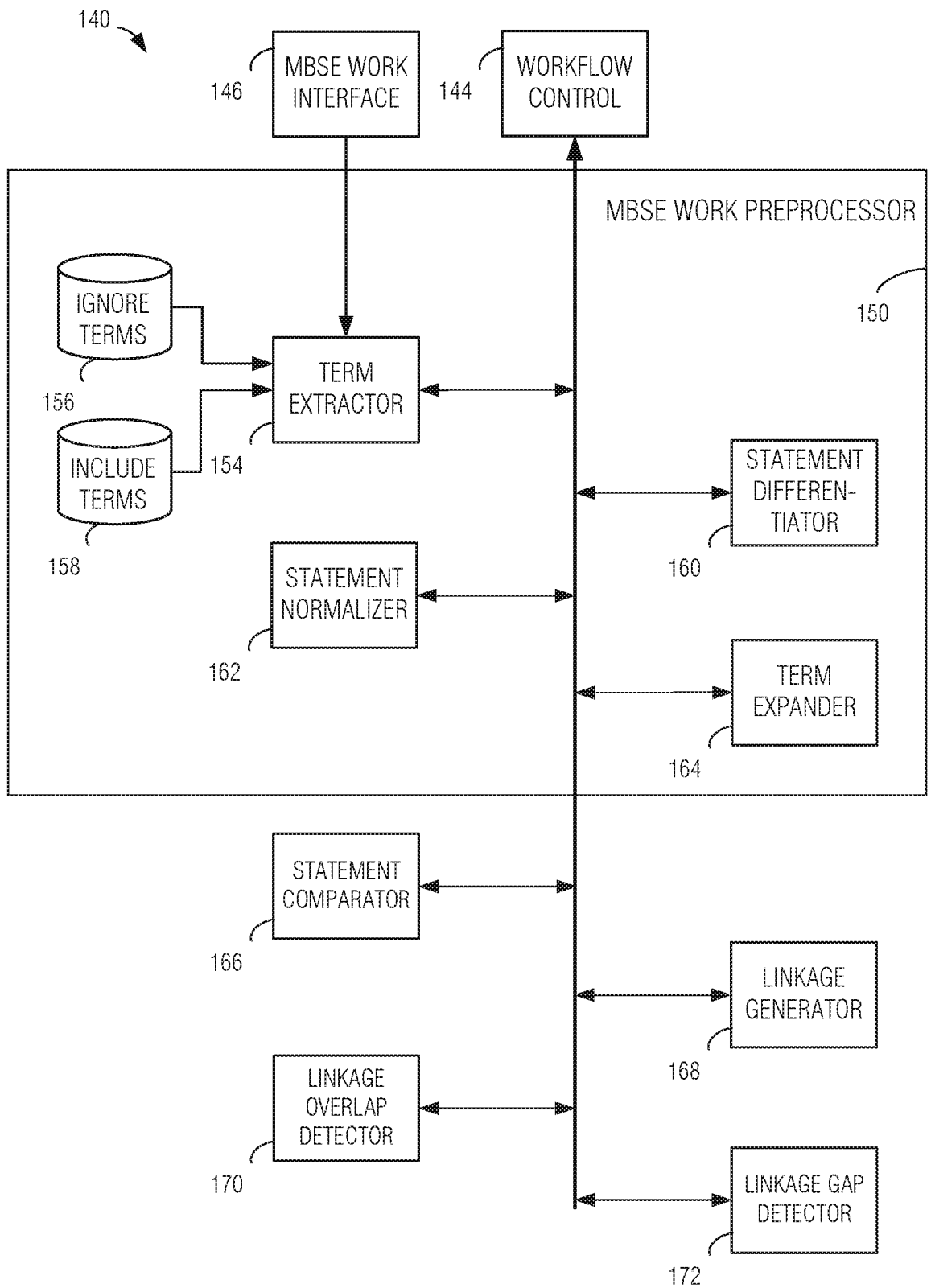
FIG. 1B is a block diagram illustrating an example system architecture of a special-purpose machine that is instantiated when processing circuitry executes program instructions to create a special-purpose machine that embodies a computational accelerator system.

FIG. 1B is a block diagram illustrating an example system architecture 140 of a special-purpose machine that is instantiated when processing circuitry 102 executes program instructions 104 to create a special-purpose machine that embodies computational accelerator system 100. As depicted in FIG. 1B, computational accelerator system 100, may be realized as a set of components, circuits, or engines, which for the sake of consistency are termed engines, although it will be understood that these terms may be used interchangeably. Engines are hardware implements (which may be controlled by software or firmware executed on one or more processors) in order to carry out a corresponding operation or set of operations. Engines are tangible entities capable of performing specified operations and may be configured or arranged in a certain manner. In an example, circuits may be arranged (e.g., internally or with respect to external entities such as other circuits) in a specified manner as an engine. In an example, the whole or part of one or more computing platforms e.g., a standalone, client or server computing platform) or one or more hardware processors may be configured by firmware or software (e.g., instructions, an application portion, or an application) as an engine that operates to perform specified operations. In an example, the software that, when executed instantiates an engine, may reside on a machine-readable medium. In an example, the software, when executed by the underlying hardware of the engine, causes the hardware to perform the specified operations. Accordingly, the term hardware engine is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein.

Considering examples in which engines are temporarily configured, each of the engines need not be instantiated at any one moment in time. For example, where the engines comprise a general-purpose hardware processor configured using software; the general-purpose hardware processor may be configured as respective different engines at different times. Software may accordingly configure a hardware processor, for example, to constitute a particular engine at one instance of time and to constitute a different engine at a different instance of time.

System architecture 140 includes workflow control engine 144 that is configured to coordinate the operation and interoperability of engines 154 and 160-170 to carry out the functionality of computational accelerator system 100. The operation of workflow control engine 144 is described in greater detail below in connection with FIG. 5.

MBSE work interface engine 146 is configured to access individual MBSE works that may be stored in a file system, for example. In related embodiments, MBSE work interface 146 includes one or more access-control provisions to facilitate accessing MBSE works that are secured, such as via cryptography, access credential, or other suitable means. In a related example, MBSE work interface engine 146 is configured to convert certain MBSE document types into a different format, or to import (e.g., selectively copy a subset of the content) from certain types of MBSE works. For example, graphical MBSE works such as engineering drawings or diagrams may be imported as text documents.

MBSE work preprocessor 150 includes term extractor engine 154, statement differentiator engine 160, statement normalizer engine 162, and term expander engine 164. Collectively, these engines operate to transform MBSE works into data structures that facilitate statement-wise comparison operations to be performed by statement comparator engine 166, with improved efficiency (e.g., requiring fewer computational operations), while achieving higher-sensitivity comparisons, than conventional textual or linguistic comparison operations applied to disparate MBSE works (e.g., having substantially different textual volume and densities, grammatical structure, etc.). The functionality of the engines constituting MBSE work preprocessor 150, according to various examples, is described below, and in FIGS. 5-9 and the corresponding description that follows.

Term extractor engine 154 is configured to gather (e.g., copy, isolate, tag, or otherwise set apart) significant terms appearing in MBSE documents, based on ignore terms data set 156 and include terms data set 158. Term extractor engine 154 operates on the imported MBSE work that is stored as the output of the operation of term extractor engine 154. Ignore terms data set 156 is a data structure stored in a physical medium that includes terms that have been deemed as having a tendency to de-sensitize decision logic that functions to discriminate between statements and the strength of statement comparisons across MBSE works. Include terms data set 158 includes important individual words, hyphenated compound words, or terms of art containing stop words, for instance, that may not otherwise be discovered by a noun phrase extraction operation. As an example, operation of term extractor engine 154 on a given MBSE work produces an extracted-term data structure, such as a list, a database, a file in ASCII or other text format, a file in an extensible markup language (XML) file format, or the like, representing that MBSE work, with non-significant terms omitted.

Statement differentiator engine 160 is configured to operate on the output of term extractor engine 154 to further process each MBSE work to produce intra-MBSE work statement segmentation. Statement segmentation involves determining which terms are to be grouped as statements. Statement differentiator engine 160 includes decision criteria that may be specific to MBSE work type. Thus, for example, different types of MBSE works may have different corresponding statement-differentiation decision criteria applied. As an example, statement differentiator engine 160 may process a MBSE work that is primarily textual in its content by utilizing punctuation cues as primary delimiters of statements.

According to various examples of statement-differentiation criteria, text that appears within a sentence, a paragraph, or a subheading, in the MBSE work, may be grouped as a single statement. In the case of processing a MBSE work that is primarily graphical in its content, statement differentiator engine 160 may use the relative positioning of text items, or spacing therebetween, as primary delimiters of statements. In another example, text associated with lead lines or arrows pointing to closely-coupled diagrammatic features may be grouped as a statement. As an example, the output of statement differentiator engine 160 may be a segmented data structure, such as a list, a database, a file in ASCII or other text format, an XML file, or the like, representing that MBSE work, with its content segmented as statements. The statements may be set apart using tags, field codes, delimiters, spacing, or punctuation, for instance, according to various examples. In a related example, each statement may have an index or other identifier associated with it within the segmented data structure.

Statement normalizer engine 162 is configured to operate on the output of statement differentiator engine 160 to apply a set of normalization criteria to each statement of a given MBSE work. Application of the normalization criteria desensitizes the term comparison operations from any variation in grammar, such as tenses, word forms, grammatical inflections, and the like, across MBSE works, which operates to relieve any bias that may be imparted on the term comparison operations due to the size, quantity, and grammatical properties of a given statement. For instance, terms that appear multiple times in a statement may tend to bias a statement comparison result by appearing to produce a deceptively high measure of similarity in some cases due to a greater hit count attributable to the same term. This deceptively high comparison measure may be contrasted with a statement comparison that produces multiple hits from different terms present across the statements being compared, which is a more meaningful similarity score in some cases.

Accordingly, in some embodiments, statement normalizer engine 162 includes duplicate term removal logic to remove repeated instances of terms from statements within a given MBSE work. Notably, statement normalizer 162 operates at the statement level, such that multiple instances of a term are permitted within a MBSE work. In a related example, statement normalizer engine 162 adds a weight to repeated terms within a statement to indicate the term's prevalence within the statement. The weight may represent a ratio of the number of instances of the repeated term to the total number of words in the statement, for example.

Statement normalizer engine 162 may further include logic to remove numerals, remove spelled-out numbers, standardize alternative spellings of terms, and remove or standardize grammatical inflections, such as verb conjugations, prefixes, suffixes, and plurals of terms. As a result of its operation, statement normalizer engine 162 produces a normalized data structure representing a given MBSE work, with statements segmented in a suitable fashion as described above, for example, with various features omitted, such as duplicate terms at the statement level, numerals, etc., and may include added tags or other indicia representing the relative weights of certain terms.

Term expander engine 164 is configured to operate on the output of statement normalizer engine 162 to tokenize each statement within of the MBSE work according to logic that defines the tokenization format, perform synonym expansion of the terms in each statement according to a predefined synonym set, and perform alternative acronym expansion of any acronyms appearing in statements of the MBSE work being processed based on a predefined list of acronym cross-references, according to an example embodiment. An example of the result of the operation of term expander engine 164 is one or more data structures representing the MBSE work, with tokenized sets of structured data representing each statement of the MBSE work. For each term of each statement of the MBSE work, the output of term expander engine 164 may include added synonym terms, and added alternative acronyms to provide a larger set.

Statement comparator engine 166 is configured to compare MBSE works that have been preprocessed by MBSE work preprocessor 150, in statement-by-statement fashion. As part of the statement-wise comparison, a measure of similarity between each pair of compared statements may be produced as a comparison result. As an example, term matches (i.e., hits count) may be totalized and a segment comparison score may be computed based on the hits count value. Statement comparator engine 166 may additionally apply weighting criteria for statements from MBSE works having weighted terms. For example, terms having similar weighting among statements from the MBSE works being compared may be associated with a bonus score to elevate the measure of similarity. Statement comparator engine 166 may store each statement-wise comparison result as a part of a set of statement-wise comparison results that is stored as a data structure in a physical medium associated with the MBSE works and statements having been compared.

The set of statement-wise comparison results may be bound to each of the MBSE works. In one such example, the set of statement-wise comparison results may be appended to each of the MBSE works with which the comparison results set is associated. In another example, the set of statement-wise comparison results may be stored in one or more data structures that are separate from the MBSE works themselves, and an association between the set of statement-wise comparison results and the MBSE works may be stored as a data structure, or portion of a data structure a database record), in a physical storage medium.

Linkage generator engine 168 is configured to assess whether any linkage is to be created between segments of MBSE works being compared. A linkage is an indicator representing the presence of related content across MBSE works, as well as identifying which particular segments relate to one another. As an example, linkage generator 168 may compare the measure of similarity produced by statement comparator engine 166 against a linkage-generation threshold value. The linkage-generation threshold value may be predefined by a user or autonomously by linkage generator engine 168. In related examples, the linkage-generation threshold may be user-variable or autonomously adaptively variable. In response to a given measure of similarity between compared segments meeting or exceeding the link-generation threshold, linkage generator engine 168 creates and stores a corresponding linkage associated with those segments in a suitable data structure in memory, such as a table, database, XML tile, or the like. In a related embodiment, as described below with reference to FIG. 11, a linkage may be associated with a numerical linkage score that represents a strength, or prominence, of that linkage.

As a result of its operation, linkage generator engine 168 may produce a linkage set data structure that identifies each segment of each MBSE work, and lists the other segments of other MBSE works with which linkages have been created, along with any applicable linkage scores.

The linkage set data structure may be stored in a physical medium of a computing platform. For instance, the linkage set data structure may be stored as a database or lookup table. In another example, the linkage set data structure may be distributed as a set of data structures corresponding to individual MBSE works. For instance, portions of the linkage set data structure may be appended to corresponding MBSE works to which those portions refer. In a related example, the linkage set data structure may be used to generate a linkage report that is formatted for interpretation by users.

Linkage overlap detector engine 170 is configured to review the linkage set data structure to compare the generated linkages associated with statements of the MBSE works, and the absence of any such linkages, against the linkages and absence of linkages of other statements within the same MBSE work to produce an intra-work linkage comparison result. Linkage overlap detector engine 170 is further configured to compare the intra-work linkage comparison result against a predefined overlap assessment criteria to determine whether any two or more statements within the same MBSE work have the same or similar linkages to statements of other MBSE works. The presence of the same or similar linkages between two statements of the same MBSE work is deemed an overlap, and indicates the possibility that the two statements having similar linkages should be combined into a single statement. Linkage overlap detector engine 170 may generate an overlap report as its output, which is formatted for interpretation by a human user.

The overlap assessment criteria may be fixed or variable, and may be user-configurable, autonomously-adjustable by linkage overlap detector engine 170, or adjustable according to a combination of user input and autonomous self-adjustment, according to various embodiments. As an example, the overlap assessment criteria may specify that an overlap exists when a first segment of a given MBSE work includes all of the linkages of a second segment of the same MBSE work. As another example, an overlap may be defined by the overlap assessment criteria when a first segment has at least 75% of the same linkages as the second segment of the same MBSE work, and the first segment has no more than 33% of additional linkages than the number of linkages of the second segment.

In a related example, the overlap assessment criteria may be variably applied for each MBSE work based on MBSE work type, or on the quantity of segments present in the corresponding MBSE work. For instance, the overlap assessment criteria may be automatically adjusted by linkage overlap detection engine 170 to be more sensitive to detecting overlaps as a function of the number of segments of the MBSE work such that MBSE works having a greater number of segments are more likely to have overlaps detected between their segments.

In a related embodiment, linkage overlap detector 170 is further configured to autonomously modify linkage set data structure to combine the representation of segments and their linkages. In a further example, linkage overlap detector 170 is configured to modify the MBSE works that have been preprocessed by MBSE work preprocessor 150 to combine segments within individual MBSE works that have been determined as meeting the overlap assessment criteria.

Linkage gap detector engine 172 is configured to review the linkage set data structure to compare the generated linkages associated with statements of the MBSE works, and the absence of any such linkages, against expected linkages to certain other MBSE works based on predefined linkage gap assessment criteria. Absences of expected linkages may be included in a linkage-gap report, formatted for interpretation by a human user, that linkage gap detector engine 172 is configured to generate.

The linkage gap assessment criteria may include a set of logical expectation rules applicable to all types of MBSE works. For instance, one such expectation rule may specify that each statement is expected to have at least one linkage to a statement of m other MBSE works, wherein m is a predefined quantity such as 1, 2, 3, etc. A related rule may specify that each statement is expected to have at least one linkage to every other MBSE work of a given project that contains a set of MBSE works that have been compared against one another.

As another example of a logical rule of linkage gap assessment criteria, the expectation rule may be conditional. For instance, the expectation rule may specify that n or more linkages to a first MBSE work from a given statement are expected when at least m linkages are present between the given statement and a second MBSE work.

In a related example, the linkage gap assessment criteria is MBSE work type-specific. For instance, an expectation rule may specify that each statement of a product architecture document is expected to have linkage to at least one design requirements specification statement, and vice-versa.

The linkage-gap report produced by linkage gap detector engine 172 may contain every instance where linkage gap detector engine 172 has applied the linkage gap assessment criteria and identified a shortfall to any linkage expectation. Accordingly, the report may indicate any MBSE works and the statements contained therein for which a linkage gap has been autonomously detected.

Figure 2:
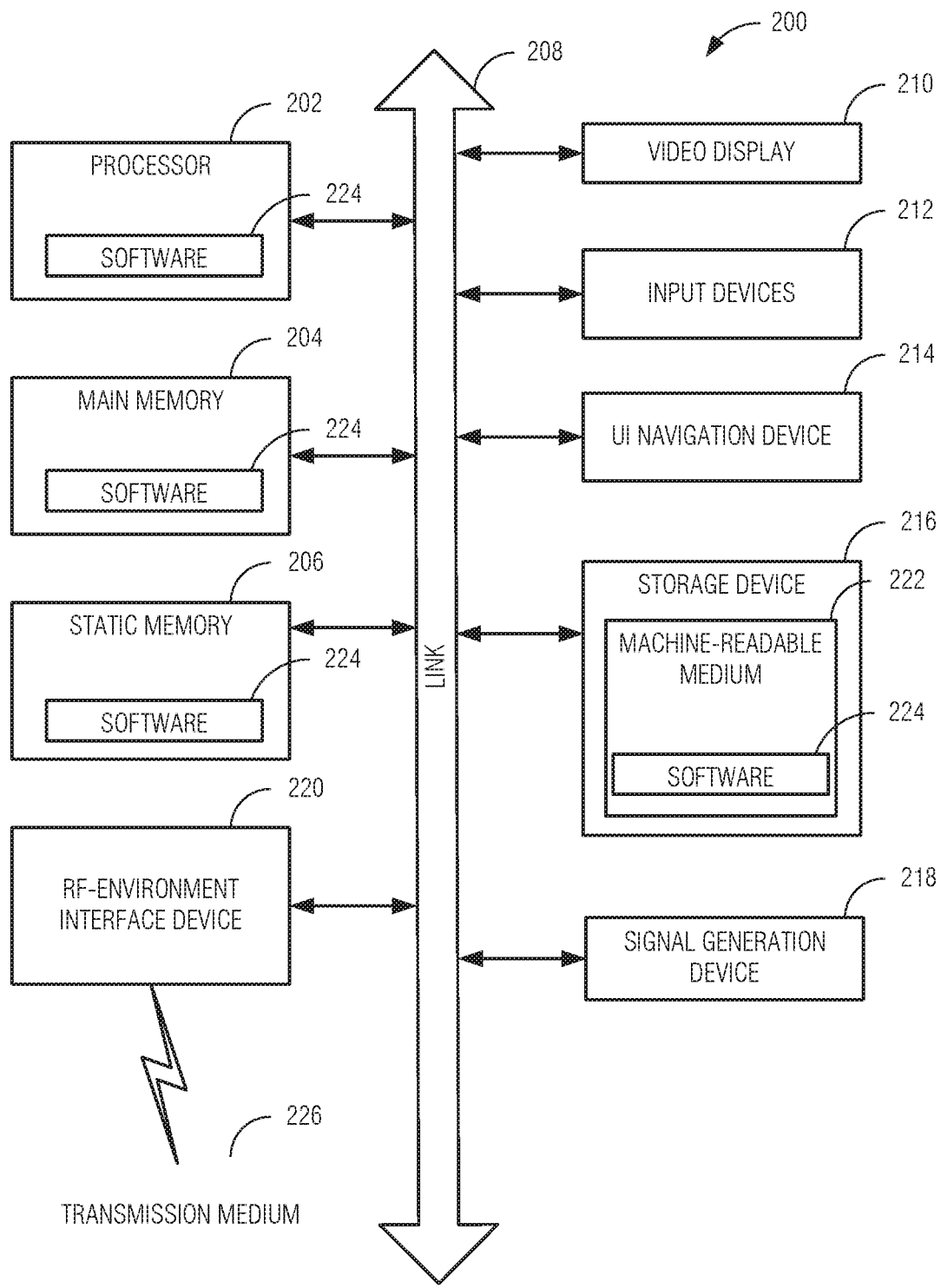
FIG. 2 is a block diagram illustrating a computing platform in the example form of a general-purpose machine, on which the system of FIG. 1 may be carried out.

FIG. 2 is a block diagram illustrating a computing platform 200 in the example form of a general-purpose machine that may be transformed into a special purpose apparatus when system 100 of FIG. 1A having example system architecture 140 as described in connection with FIG. 1B above, is instantiated according to some embodiments. In a networked deployment, the computing platform 200 may operate in the capacity of either a server or a client machine in server-client network environments, or it may act as a peer machine in peer-to-peer (or distributed) network environments.

System 100 having example system architecture 140 according to various embodiments detailed herein provides a number of advantages to improve the performance, in terms of effectiveness for MBSE document comparison, and computational efficiency, over conventional document and workflow management solutions that may otherwise be executed on a general-purpose computing platform such as computing platform 200. For example, the operations of MBSE work preprocessor 150 create a statement-based paradigm for autonomous comparison of MBSE works. The combined operations of statement differentiator engine 160, term extractor engine 154, and statement normalizer engine 162 operate to generate data structures having content in which duplicative and non-distinguishing terms are omitted, thereby allowing the computing platform 200 to focus the computational resources for the compare operations on meaningful content, for example.

Example computing platform 200 includes at least one processor 202 (e.g., a central processing unit (CPU), a graphics processing unit (GPU) or both, processor cores, compute nodes, etc.), a main memory 204 and a static memory 206, which communicate with each other via a link 208 (e.g., bus). The computing platform 200 may further include a video display unit 210, input devices 212 (e.g., a keyboard, camera, microphone), and a user interface (UI) navigation device 214 (e.g., mouse, touchscreen). The computing platform 200 may additionally include a storage device 216 (e.g., a drive unit), a signal generation device 218 (e.g., a speaker), and a RF-environment interface device (RFEID) 220.

The storage device 216 includes a machine-readable medium 222 on which is stored one or more sets of data structures and instructions 224 (e.g., software) embodying or utilized by any one or more of the methodologies or functions described herein. The instructions 224 may also reside, completely or at least partially, within the main memory 204, static memory 206, and/or within the processor 202 during execution thereof by the computing platform 200, with the main memory 204, static memory 206, and the processor 202 also constituting machine-readable media.

While the machine-readable medium 222 is illustrated in an example embodiment to be a single medium, the term "machine-readable medium" may include a single medium or multiple media (e.g., a centralized or distributed database, and/or associated caches and servers) that store the one or more instructions 224. The term "machine-readable medium" shall also be taken to include any tangible medium that is capable of storing, encoding or carrying instructions for execution by the machine and that cause the machine to perform any one or more of the methodologies of the present disclosure or that is capable of storing, encoding or carrying data structures utilized by or associated with such instructions. The term "machine-readable medium" shall accordingly be taken to include, but not be limited to, solid-state memories, and optical and magnetic media. Specific examples of machine-readable media include non-volatile memory, including but not limited to, by way of example, semiconductor memory devices (e.g., electrically programmable read-only memory (EPROM), electrically erasable programmable read-only memory (EEPROM)) and flash memory devices; magnetic disks such as internal hard disks and removable disks; magneto-optical disks; and CD-ROM and DVD-ROM disks.

RFEID 220 includes radio receiver circuitry, along with analog-to-digital conversion circuitry, and interface circuitry to communicate via link 208 according to various embodiments. Various form factors are contemplated for RFEID 220. For instance, RFEID may be in the form of a wideband radio receiver, or scanning radio receiver, that interfaces with processor 202 via link 208. In one example, link 208 includes a PCI Express (PCIe) bus, including a slot into which the NIC form-factor may removably engage. In another embodiment, RFEID 220 includes circuitry laid out on a motherboard together with local link circuitry, processor interface circuitry, other input/output circuitry, memory circuitry, storage device and peripheral controller circuitry, and the like. In another embodiment, RFEID 220 is a peripheral that interfaces with link 208 via a peripheral input/output port such as a universal serial bus (USB) port. RFEID 220 receives RF emissions over wireless transmission medium 226. RFEID 220 may be constructed to receive RADAR signaling, radio communications signaling, unintentional emissions, or some combination of such emissions.

Figure 3:
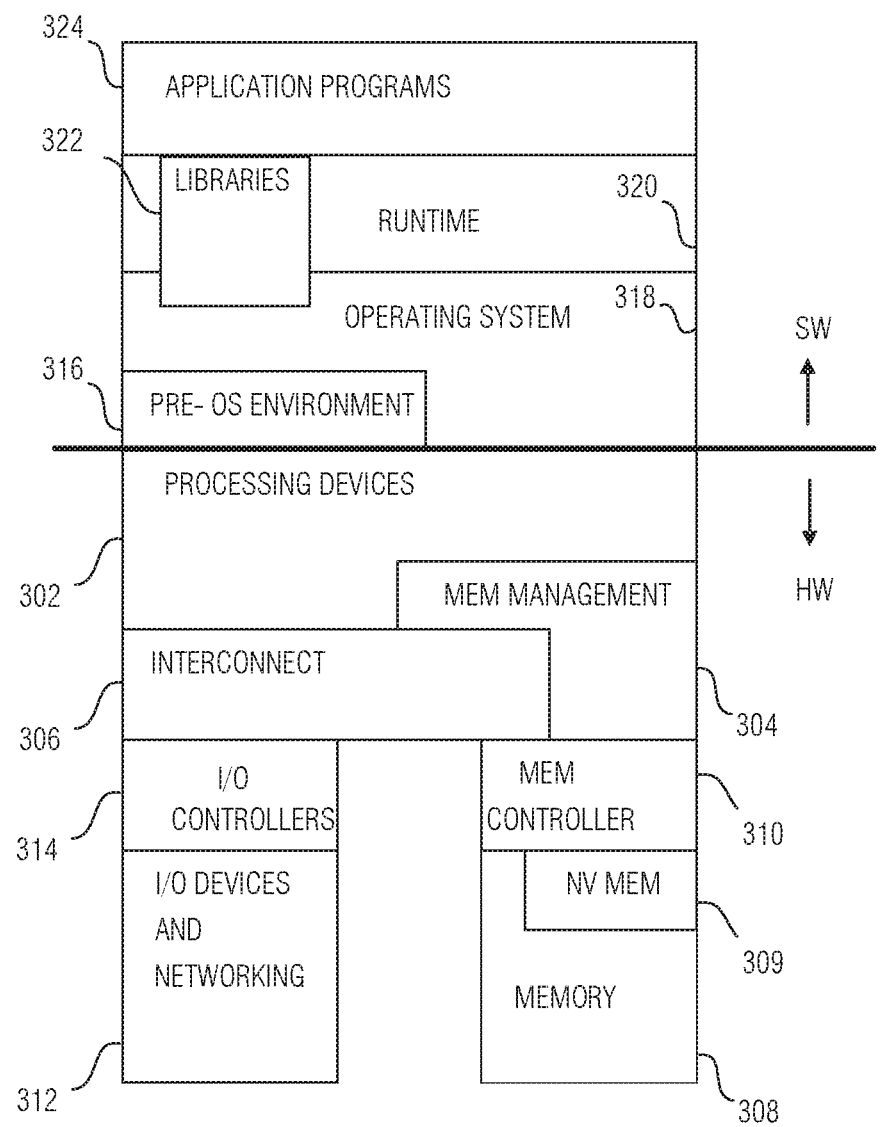
FIG. 3 is a diagram illustrating an exemplary hardware and software architecture of a computing device such as the one depicted in FIG. 2, in which various interfaces between hardware components and software components are shown.

FIG. 3 is a diagram illustrating an exemplary hardware and software architecture of a computing device in which various interfaces between hardware components and software components are shown. The example hardware and software architecture of FIG. 3 may be implemented in computing platform 200 (FIG. 2), for instance. As indicated by HW, hardware components are represented below the divider line, whereas software components denoted by SW reside above the divider line. On the hardware side, processing devices 302 (which may include one or more microprocessors, digital signal processors, etc.), each having one or more processor cores, are interfaced with memory management device 304 and system interconnect 306. Memory management device 304 provides mappings between virtual memory used by processes being executed, and the physical memory. Memory management device 304 may be an integral part of a central processing unit which also includes the processing devices 302.

Interconnect 306 includes a backplane such as memory, data, and control lines, as well as the interface with input/output devices, e.g., PCI, USB, etc. Memory 308 (e.g., dynamic random access memory or DRAM) and non-volatile memory 309 such as flash memory (e.g., electrically-erasable read-only memory such as EEPROM, NAND Flash, NOR Flash, etc.) are interfaced with memory management device 304 and interconnect 306 via memory controller 310. This architecture may support direct memory access (DMA) by peripherals in one type of embodiment. I/O devices, including video and audio adapters, non-volatile storage, external peripheral links such as USB, Bluetooth, etc., as well as network interface devices such as those communicating via Wi-Fi or LTE-family interfaces, are collectively represented as I/O devices and networking 312, which interface with interconnect 306 via corresponding I/O controllers 314.

On the software side, a pre-operating system (pre-OS) environment 316 is executed at initial system start-up and is responsible for initiating the boot-up of the operating system. One traditional example of pre-OS environment 316 is a system basic input/output system (BIOS). In present-day systems, a unified extensible firmware interface (UEFI) is implemented. Pre-OS environment 316 is responsible for initialing the launching of the operating system, but also provides an execution environment for embedded applications according to certain aspects of the invention.

Operating system (OS) 318 provides a kernel that controls the hardware devices, manages memory access for programs in memory, coordinates tasks and facilitates multi-tasking, organizes data to be stored, assigns memory space and other resources, loads program binary code into memory, initiates execution of the application program which then interacts with the user and with hardware devices, and detects and responds to various defined interrupts. Also, operating system 318 provides device drivers, and a variety of common services such as those that facilitate interfacing with peripherals and networking, that provide abstraction for application programs so that the applications do not need to be responsible for handling the details of such common operations. Operating system 318 additionally provides a graphical user interface (GUI) engine that facilitates interaction with the user via peripheral devices such as a monitor, keyboard, mouse, microphone, video camera, touchscreen, and the like.

Runtime system 320 implements portions of an execution model, including such operations as putting parameters onto the stack before a function call, the behavior of disk input/output (I/O), and parallel execution-related behaviors. Runtime system 320 may also perform support services such as type checking, debugging, or code generation and optimization.

Libraries 322 include collections of program functions that provide further abstraction for application programs. These include shared libraries and dynamic linked libraries (DLLs), for example. Libraries 322 may be integral to the operating system 318, runtime system 320, or may be added-on features, or even remotely-hosted. Libraries 322 define an application program interface (API) through which a variety of function calls may be made by application programs 324 to invoke the services provided by the operating system 318. Application programs 324 are those programs that perform useful tasks for users, beyond the tasks performed by lower-level system programs that coordinate the basis operability of the computing device itself.

Figure 4:
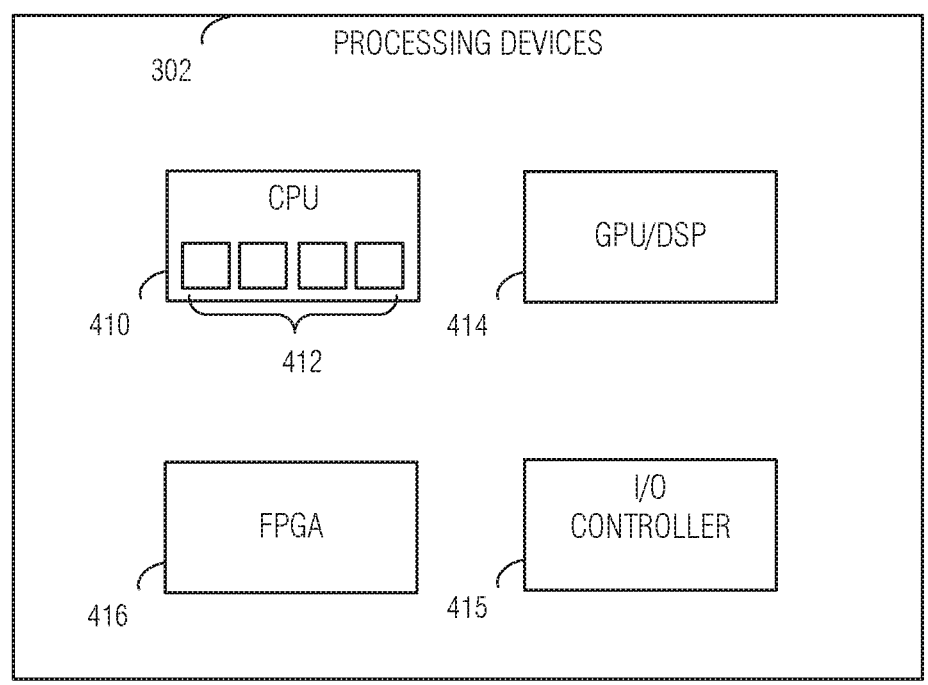
FIG. 4 is a block diagram illustrating examples of processing devices that may be implemented on a computing platform, such as the computing platform described with reference to FIGS. 2-3, according to an embodiment.

FIG. 4 is a block diagram illustrating processing devices 302 according to one type of embodiment. CPU 410 may contain one or more processing cores 412, each of which has one or more arithmetic logic units (ALU), instruction fetch unit, instruction decode unit, control unit, registers, data stack pointer, program counter, and other essential components according to the particular architecture of the processor. As an illustrative example, CPU 410 may be a x86-type of processor. Processing devices 302 may also include a graphics processing unit (GPU) or digital signal processor (DSP) 414. In these embodiments, GPU/DSP 414 may be a specialized co-processor that offloads certain computationally-intensive operations, particularly those associated with numerical computation, from CPU 410. Notably, CPU 410 and GPU/DSP 414 may work collaboratively, sharing access to memory resources, I/O channels, etc.

Processing devices 302 may also include a specialized processor 416, such a field-programmable gate array (FPGA), for example. Specialized processor 416 generally does not participate in the processing work to carry out software code as CPU 410 and GPU 414 may do. In one type of embodiment, specialized processor 416 is configured to execute time-critical operations, such as real-time, or near-real-time signal processing. Specialized processor 416 may execute dedicated firmware. Specialized processor 416 may also include a dedicated set of I/O facilities to enable it to communicate with external entities. Input/output (I/O) controller 415 coordinates information flow between the various processing devices 410, 414, 416, as well as with external circuitry, such as a system interconnect.

Figure 5:
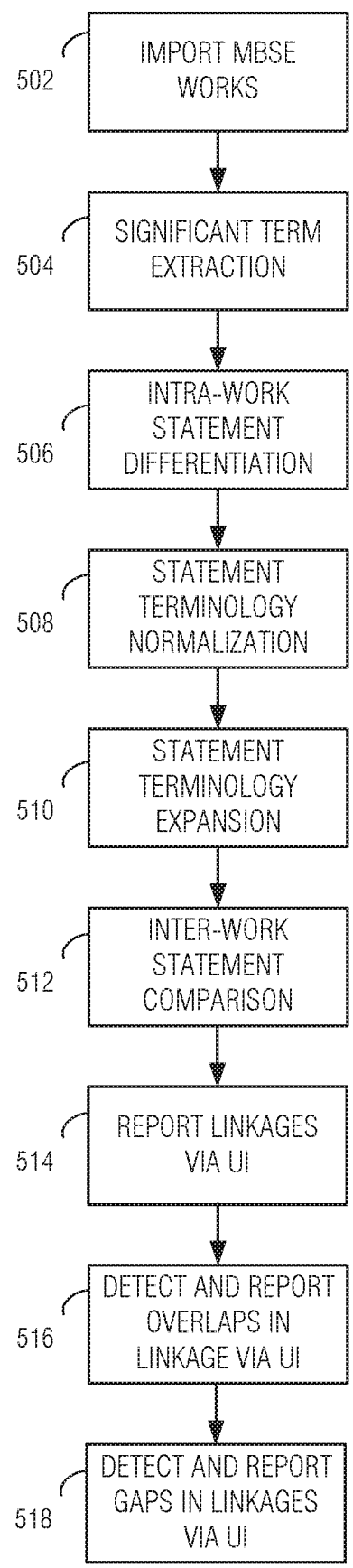
FIG. 5 is a process flow diagram illustrating a high-level operational workflow that may be carried out by a computing platform, such as the system of FIG. 1, according to some embodiments.

FIG. 5 is a process flow diagram illustrating a high-level operational workflow that may be carried out by a computing platform under program control, such as system 100 (FIG. 1A) having architecture 140 (FIG. 1B), according to some embodiments. The process is a machine-implemented process that includes autonomous operations (e.g., without user supervision), though the operation of the process may be user user-initiated, and it may feature interaction with a user in some respects. In addition, it is important to note that the process depicted in FIG. 5 is a richly-featured embodiment that may be realized as described; in addition, portions of the process may be implemented while others are omitted in various embodiments. The following Additional Notes and Examples section details various combinations, without limitation, that are contemplated. It should also be noted that in various embodiments, certain process operations may be performed in a different ordering than depicted in FIG. 5.

At 502, MBSE work interface 146 imports MBSE works into a data store for processing. The data store may be physically realized as a file in the computing platform's file system, or allocated storage space in memory, for example. The process of importation may be specific to each type of MBSE work. For instance, engineering documents, such as requirements specifications, test procedures, etc., which are primarily textual, may be imported virtually in their entirety as plain text, tabular, or tagged documents such as extensible markup language (XML) documents. Notably, certain layout or formatting indicators may be reflected in some suitable fashion, such as using field codes, tagging, or other technique, such that the imported textual MBSE work retains at least indicia of these features. Architectural models, which may be primarily visual in nature, may be imported as extracted text portions that omit graphical features, also as plain text, tabular, or tagged documents such as extensible markup language (XML) documents. In a related example, the visual spacing of text blocks may be taken into account using tables, tags, etc.

Figure 6:
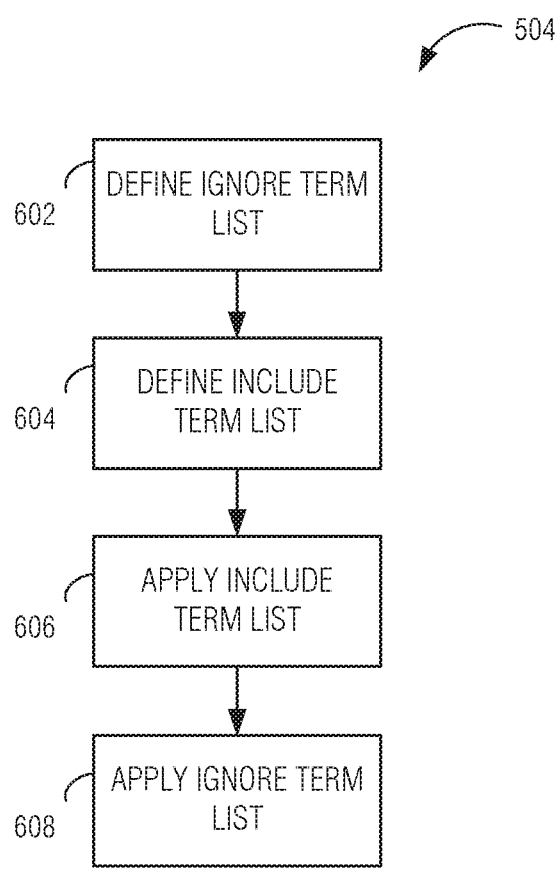
FIG. 6 is a process flow diagram illustrating significant-term extraction operations according to some embodiments.

At 504, term extractor engine 154 performs significant-term extraction, an example of which is described with reference to FIG. 6. FIG. 6 is a process flow diagram illustrating significant-term extraction operations according to some embodiments. At 602, the ignore term list is defined and stored in a physical medium (e.g., memory, virtual memory, file system, etc.). This operation may be performed autonomously according to some embodiments by application of decision logic. In an example, definition of the ignore term list includes automated examination of an individual MBSE work to determine if any term appears distributed throughout the work. For instance, for a project involving radio communications, the term "RF" may be found to appear throughout a given work at multiple instances, and at various locations. The presence of "RF" throughout a MBSE work tends to de-sensitize decision logic that functions to discriminate between statements and the strength of statement comparisons across MBSE works. Any suitable function, such as a heuristic function, may be applied as decision logic for assessing the ubiquity of a given term distributed throughout a MBSE work. Defining of the ignore term list may proceed term-by-term, examining the MBSE work as a whole. The ignore term list may also compile a list of pronouns, articles, conjunctions, and other parts of speech that convey little or no meaning outside of the context in which they are present.

At 604, the include term list is defined for the MBSE work. The include term list includes important individual words, hyphenated compound words, or terms of art containing stop words, for instance, that may not otherwise be discovered by a noun phrase extraction operation. In one example, the include term list may be automatically generated based on searching for regular expression patterns that occur in the corpus of MBSE works. In some examples, an n-gram analysis may be performed on the corpus and relatively longer n-grams that do not contain ignore-list terms may be selected for inclusion in the include list.

At 606, the include term list, which was previously defined, is applied to the text of the MBSE work to fix the included terms. For instance, the term "radio front end module" appearing in the MBSE work and in the include term list may be changed to radio_front_end_module to ensure that the individual words from which this term of art is composed are not re-ordered by further processing. At 608, the ignore term list is applied to the MBSE work to remove those terms which have been identified as being insignificant.

Returning to FIG. 5, at operational block 506, statement differentiator engine 160 performs intra-MBSE work statement differentiation. This set of operations involves separately delineating the individual statements in the MBSE work to produce a data structure that indicates statement boundaries. The data structure may use tags, fields, or any other suitable delineation to indicate boundaries between statements. Any suitable statement-differentiation logic may be applied, including predefined decision-criteria or heuristic techniques. For example, in an original textual MBSE work, the punctuation, headings, subheadings, or white space may be present as delimiters between statements. Formatting indicia retained in the imported copies of these MBSE works may be utilized to differentiate one statement from the next.

Figure 7:
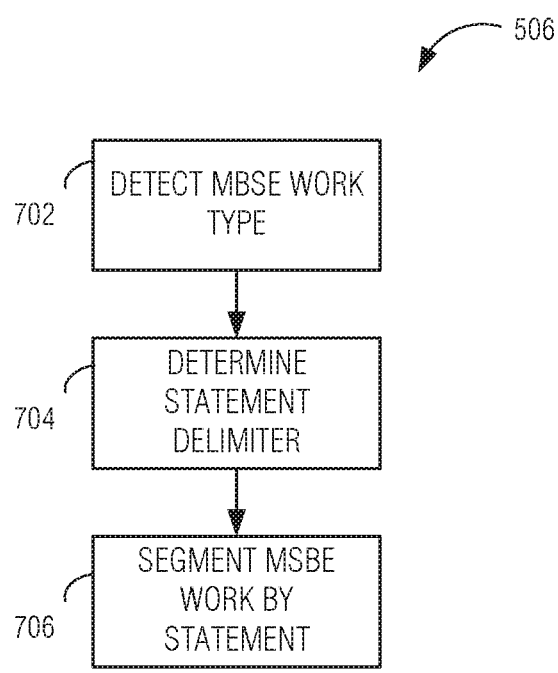
FIG. 7 is a flow diagram illustrating statement differentiation operations according to an example embodiment.

FIG. 7 is a flow diagram illustrating statement differentiation block 506 according to an example embodiment. At 702 statement differentiator 160 detects a MBSE work type. In a simple example, the MBSE work type may be indicated as part of the metadata of the MBSE work using a type indicator. The type indicator may be informative as to the nature of statement structuring in the MBSE document. In another embodiment, properties of the MBSE work may be examined and compared against MBSE type-determining criteria with which statement differentiator engine 160 is configured.

At 704, statement differentiator engine 160 determines a type-specific statement delimiter. As an example, for one type of MBSE work, punctuation may be a primary delimiter of statements; whereas in another type of MBSE work, headings or subheadings may be selected as the proper delimiter. Selection of the delimiter may be based on preconfigured selection logic in an example. In another example, the delimiter selection is based on the type of MBSE work being processed. In still another example, the delimiter selection logic may use heuristics or machine learning techniques to determine the proper delimiters to use for each particular MBSE work. For other types of MBSE works, relative groupings of terms, such as positioning on a sheet, association with various graphical elements, etc., may be used as the statement-delimiting criteria.

At 706, each MBSE work is segmented with individual statements clearly delineated. Each MBSE work may be represented as a table, database, or other suitable data structure representing a plurality of statements.

Figure 8:
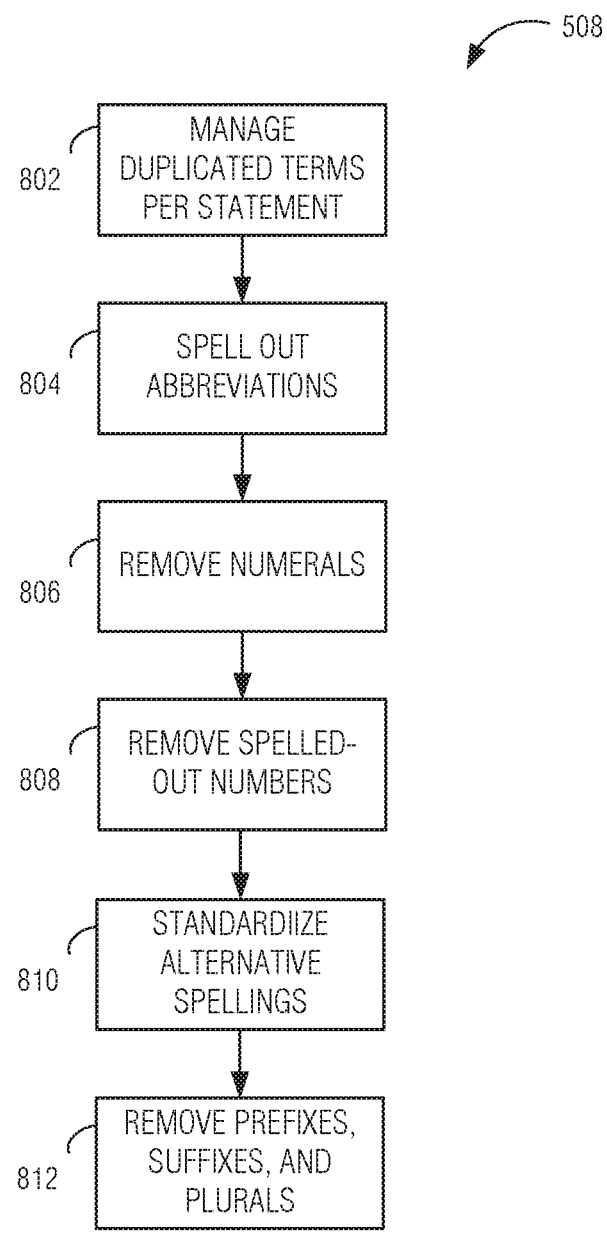
FIG. 8 is a flow diagram illustrating an example of a normalization procedure according to some embodiments.

Returning to FIG. 5, at 508, statement normalizer engine 162 normalizes statement of each MBSE work to desensitize the term comparison operations from any variation in grammar, such as tenses, word forms, and the like, across MBSE works, and relieve any inherent bias that may be imparted on the term comparison operations due to the size, or quantity, of a given statement. FIG. 8 is a flow diagram illustrating an example of a normalization procedure. At 802, duplicated terms appearing within the same statement are managed. Intra-statement duplicates may be omitted entirely from the statement, resulting in a non-repeating set of the various terms that are present in the statement. In a related embodiment, terms may be associated with a ratio to overall term count within the statement as part of the normalization. Thus, for instance, for a statement containing a total of 20 terms, of which there are 5 instances of a particular term, that term may be associated with ratio of ¼.

At 804, abbreviated terms within each statement are spelled out. Abbreviations include terms such as "xfer," "Rx," etc. The abbreviations may be spelled out according to a predefined abbreviation expansion list. At 806, numerals are omitted. Similarly, at 808, spelled-out numbers, are omitted as well. At 810, terms that are susceptible to alternative spellings are normalized according to a spelling policy list. For example, terms such as "gray," "grey," "armor," "armour," "stabilize," "stabilise," etc, are standardized. At 812, term is stemmed to remove prefixes, suffixes, plurals, and other variations.

Figure 9:
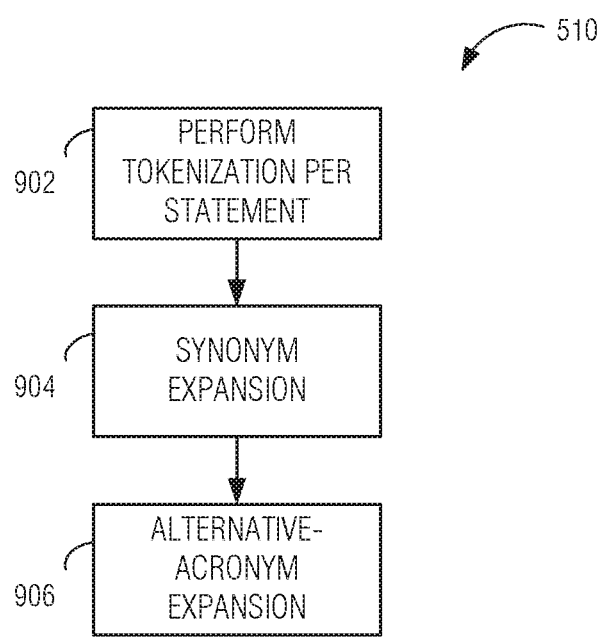
FIG. 9 is a flow diagram illustrating an example of statement terminology expansion operations according to some embodiments.

Returning again to FIG. 5, at operational block 510, term expander engine 164 performs statement terminology expansion. FIG. 9 illustrates example operations constituting block 510. At 902, tokenization is performed, per statement, to create a list, or other suitable data structure, of the significant, normalized, terms that constitute each statement. At 904, synonym expansion is performed, where each term of each statement may be replaced by a set of normalized synonymous terms, along with the original, normalized, term. At 906, acronyms, which may be treated as words, are similarly expanded with known alternative acronyms having similar meaning, according to a predefined acronym knowledge base.

Referring again to FIG. 5, operations 502-510, which may be considered as preprocessing operations for linkage-assessment readiness, are carried out by MBSE work preprocessor 150 for each MBSE work. As an example, the result of these operations is a hierarchical representation of each MBSE work, segmented according to the constituent statements, with each segment represented by an expanded set of terms that were expanded from normalized significant terms extracted from the original statement. Optionally, the terms of each expanded set may be associated with additional indicia, such as assessed weighting indication, part of speech tag, or other indicator, which may be present in combination with one or more other additional indicators.

Figure 10:
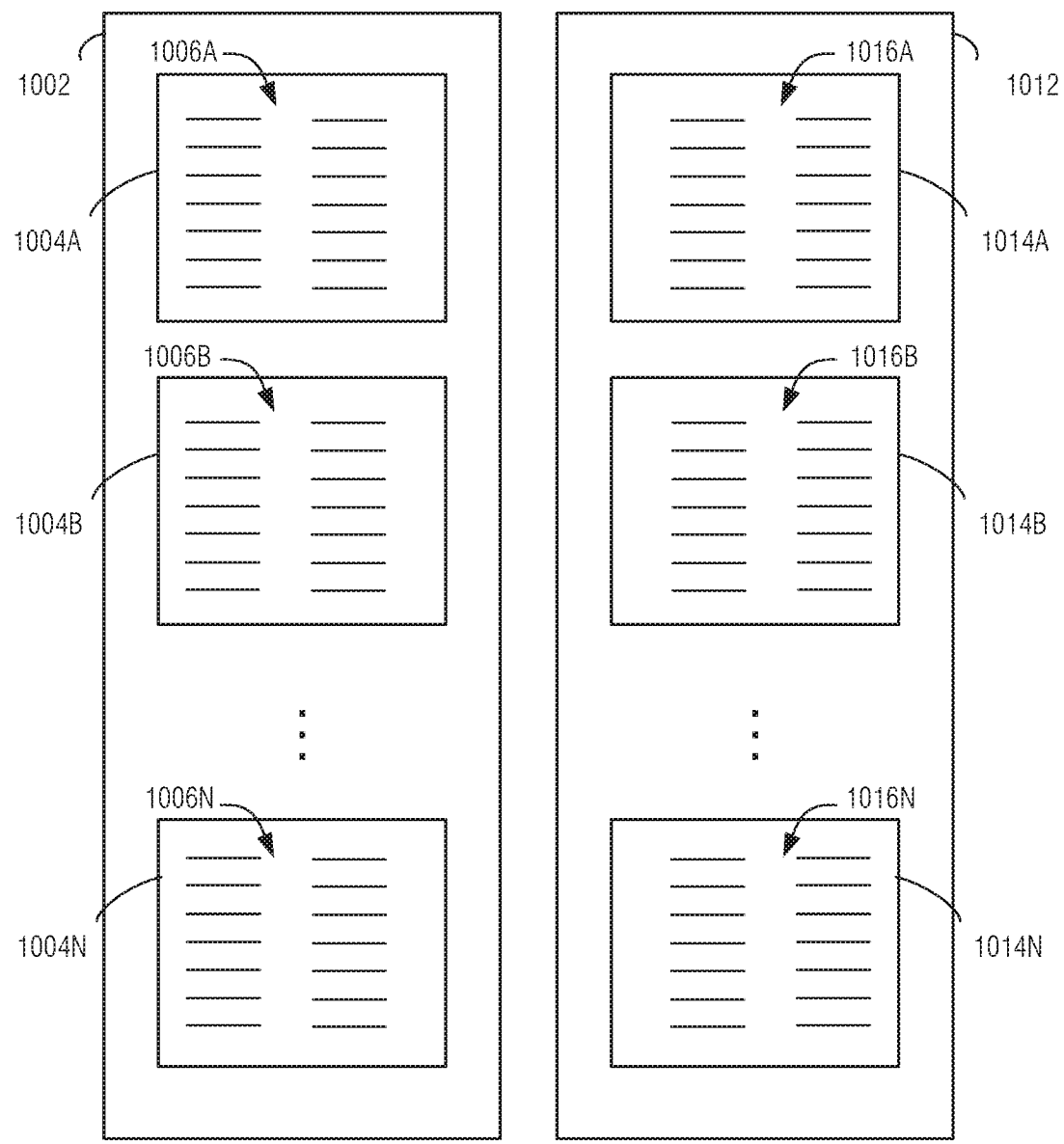
FIG. 10 is a diagram illustrating an example of the content of preprocessed MBSE works according to an illustrative embodiment.

FIG. 10 is a diagram illustrating an example of the preprocessed MBSE works according to an illustrative embodiment. A first preprocessed MBSE work 1002, and a second preprocessed MBSE work 1012 are depicted, each being stored in a physical medium as a data structure containing a plurality of segments corresponding to statements. First preprocessed MBSE work 1002 includes segments 1004A, 1004B, . . . , 1004N. Second preprocessed MBSE work 1012 includes segments 1014A, 1014B, . . . , 1014N. Each segment 1004, 1014 contains a corresponding expanded set of terms 1006A, 1006B, . . . , 1006N (for segments 1004); and expanded sets 1016A, 1016B, . . . , 1016N (for segments 1014).

Figure 11:
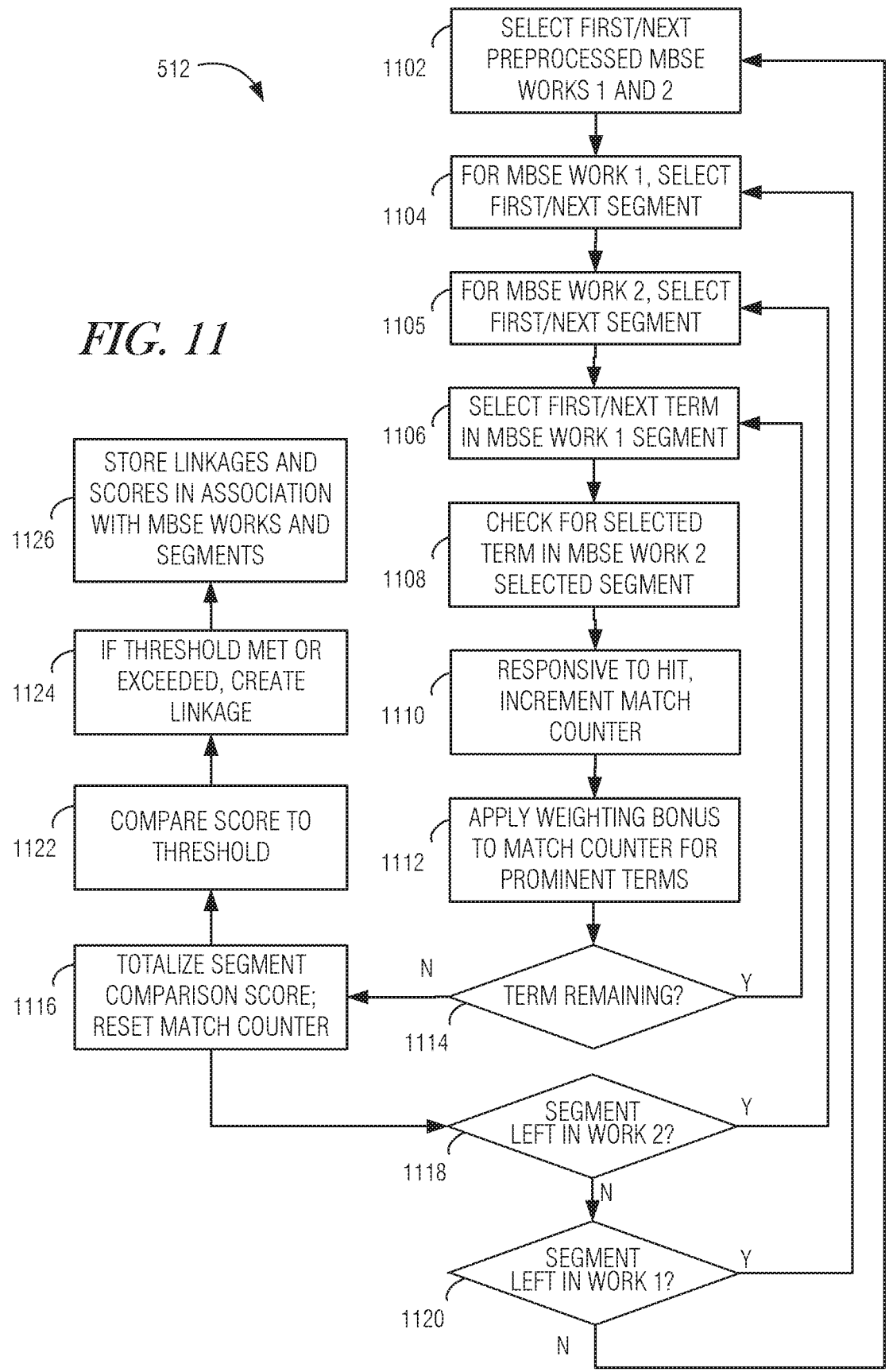
FIG. 11 is a flow diagram illustrating an example set of operations for performing comparison operations according to various embodiments.

As depicted in the processes of FIG. 5, at 512, statement comparator engine 166 compares MBSE work statements against one another as an inter-work statement comparison operations to produce linkage determinations as between the MBSE works. FIG. 11 is a flow diagram illustrating an example set of operations for performing the comparison operations according to various embodiments. At 1102, MBSE works to be compared, such as MBSE works 1002 and 1012 (FIG. 10) are selected from among the MBSE works of a project. The selection of the MBSE works for the current comparison may be accomplished by selecting the next pairing of MBSE works from a list of MBSE works subject to comparison, for example. For purposes of this example, these works are referred to as MBSE works 1 and 2. At 1104, the first segment of MBSE work 1 (e.g., 1004A) is selected for linkage-determination processing. Likewise, at 1105, the first segment of MBSE work 2 (e.g., 1014A) is selected. At 1106, the first term of the expanded set of terms (e.g., 1006A) of the selected segment of MBSE work 1 is selected for comparison processing. At 1108, the selected segment (e.g., 1016A) of MBSE work 2 is scanned for the presence of the selected term from the currently-selected segment of MBSE work 1.

At 1110, in response to a hit, i.e., the presence of the searched-for term in the selected segment of MBSE work 2, a match counter, which may be stored in a physical medium, is incremented. In embodiments utilizing proportional weighting of terms (taking into account their frequent use within the particular segment), a weighting bonus may be applied at 1112 to augment the match counter according to a defined weighting factor.

At decision 1114, the process loops to 1106 to select the next term in the current segment of MBSE work 1 to be searched for in the current segment of MBSE work 2, provided that there are further unsearched terms remaining in the current segment of MBSE work 1. This loop continues until all of the terms of the current segment of MBSE work 1 are searched. Upon completion of the current segment of MBSE work 1, the segment comparison score corresponding to the two segments being compared from across MBSE works 1 and 2 is totalized at 1116 and stored in a table or other suitable data structure to be stored in a physical medium, that associates the segment comparison score with the MSBE works and segments that were the subject of the comparison, and the match counter is reset for further processing. Totalization may include a normalization computation such as, for instance:

Segment Comparison Score=(Hits Count)*2/(Total Term Count).

At 1118, the process determines if any segments remain in MBSE work 2 and, in the affirmative case, the process loops to 1105 to select the next segment of MBSE work 2 (e.g., 1014B), and compare each of the terms of the current segment of MBSE 1 with the next selected segment of MBSE work 2. The process proceeds to search for the presence of each term of the current segment of MBSE work 1 among the terms of each segment of MBSE work 2. For each new segment-segment comparison, a corresponding segment comparison score is totalized and stored at 1116. Once each segment of MBSE work 2 has been searched, decision 1120 loops the process to 1104, at which point the next segment (e.g., 1004B) of MBSE work 1 is selected. Ultimately, the presence of each term of every segment of MBSE work 1 is searched among the terms of each segment of MBSE work 2, and each segment-segment pairing is assigned a corresponding score based on the hits count for that pairing.

After all segments of the MBSE works have been compared and scores totaled, each segment comparison score is compared against a defined threshold at 1122. The threshold may be predefined according to a user-selected value, or it may have been determined using a machine learning algorithm, according to some examples. In a related example, a fuzzy threshold is applied. At 1124, in response to meeting or exceeding of the threshold, a linkage for the segment pair is created. The linkage may be further appraised based on the corresponding comparison scoring. For example, a linkage appraisal value equal to, or algorithmically derived from, the totalized comparison scoring, may be associated with the linkage. Thus, some linkages may be found to be more prominent than others. At 1126, the linkages and their individual scores, if applicable, are stored in association with the MBSE works and the segments that were compared.

Upon completion of assessing the linkages as between the segments of MBSE works 1 and 2, the positions of MBSE works 1 and 2 may be reversed, with the presence of the terms of the segments of MBSE 2 being searched in each of the segments MBSE work 1. This re-positioning of keyword and corpus provides opportunity to detect additional linkages that may not have been detected in the first positioning. Any additional permutations of MBSE work pairings may be subsequently processed in the same manner to detect linkages.

Returning again to FIG. 5, at 514, linkage generator 168 produces a linkage report identifying the detected linkages between the segments of all of the MBSE works. In some embodiments, the report includes scoring indicating the various relative strengths of the linkages. The report may further include indicators of mappings between the segments and the statements of each corresponding MBSE work. The report may be presented in tabular form, or it may be prepared in machine-readable format (e.g., XML) to be further processed for visual presentation at the UI.

Advantageously, the reporting of detected linkages and their scores may be used as a decision support system to assist human users in finding and assessing linkages between MBSE work statements. Although the system may certainly operate entirely autonomously, there may still be an option to utilize a human reviewer or team of reviewers. Accordingly, the reporting can inform users to quickly and efficiently decide if they should accept or modify linkage determinations. The reporting may further display a list of matching terms to help a person or team quickly and efficient decide if they should accept the proposed linkages. The reporting can quickly and efficiently search for similar linkages, which may be useful for supporting decisions as to whether to accept or reject a proposed linkage.

At 516 linkage overlap detector 170 operates to detect and report overlaps in linkages. As discussed above, overlaps may be defined as the presence of the same or similar linkages for multiple distinct statements in a given MBSE work. The existence of an overlap may be indicative of a preference or need to consolidate those multiple statements into a single statement for ease of documentation, modeling, and linkage management over a project's lifecycle.

At 518, linkage gap detector 172 performs a further set of operations to detect and report gaps in linkages. For instance, any segment of a given MBSE work that has no detected linkage to one or more other segments of other MBSE works may be identified and flagged as a potential linkage gap. A variety of criteria may be applied to detect gaps in linkage, such as criteria particularized to the various types of MBSE works. For instance, as discussed above, it may be premised that each statement of a product architecture document should properly be linked to at least one design requirements specification statement, and vice-versa. Accordingly, a gap-analysis process may evaluate each segment of those MBSE works for the expected linkages.

ADDITIONAL NOTES & EXAMPLES

Example 1 is a computational accelerator system for determination of linkages across disparate works in a model-based system engineering (MBSE) regime, the system comprising: a MBSE work interface input to access textual content of a first MBSE work and textual content of a second MBSE work, wherein the textual content of each MBSE work includes, a plurality of textual statements, and wherein the textual content of the first MBSE work is structurally, grammatically, and quantitatively diverse from the textual content of the second MBSE work; a MBSE work preprocessor communicatively coupled to the MBSE work interface input, and configured to autonomously preprocess each MBSE work to produce a first preprocessed data structure representing the first MBSE work and a second preprocessed data structure representing the second MBSE work, wherein the MBSE work preprocessor comprises: a term extractor to gather significant terms from the textual content of each MBSE work, wherein the significant terms include terms of the textual content of each MBSE work that differentiate individual statements from among other statements of the same MBSE work, and omit terms that are distributed throughout that MBSE work; and a statement differentiator to delineate the textual content of each MBSE work into segments corresponding to separately identifiable textual statements of that MBSE work; a statement comparator to autonomously perform a segment-wise comparison between segment pairings of the first preprocessed data structure and the second preprocessed data structure to produce a set of segment-wise comparison results based on terms common to each segment pairing; and a linkage generator to autonomously determine statement-wise linkages between statements of the first MBSE work and the second MBSE work based on the set of segment-wise comparison results, and store the statement-wise linkages as a linkage set data structure.

In Example 2, the subject matter of Example 1 includes, wherein the MBSE work preprocessor further comprises: a statement normalizer to normalize the significant terms of each MBSE work to remove any repeated instances of terms occurring within each segment such that only a single instance of any of the repeated instances remains in each corresponding segment.

In Example 3, the subject matter of Example 2 includes, wherein the statement normalizer is to further standardize any grammatical inflections among the significant terms of each MBSE work.

In Example 4, the subject matter of Examples 2-3 includes, wherein the statement normalizer is to add a weighting indicator to each single instance of any removed repeated instances of the terms appearing within each segment, wherein the weighting indicator indicates a degree of prevalence of each single instance.

In Example 5, the subject matter of Examples 3-4 includes, wherein the degree of prevalence is based on a ratio of a quantity of repeated instances of each repeated term within the corresponding segment prior to removal of those repeated instances, to a total quantity of words in that segment.

In Example 6, the subject matter of Examples 2-5 includes, wherein the MBSE work preprocessor further comprises: a term expander to add an expanded term set for each of the significant terms that includes the normalized significant terms and terms that are synonymous with the significant terms to each corresponding preprocessed data structure.

In Example 7, the subject matter of Examples 1-6 includes, a computing platform that includes a processor circuitry, data storage circuitry, and input/output facilities; wherein the MBSE work interface input, the MBSE work preprocessor, the statement comparator and the linkage generator are implemented on the computing platform.

In Example 8, the subject matter of Examples 1-7 includes, wherein the MBSE work interface input, the MBSE work preprocessor, the statement comparator, and the linkage generator are each a hardware-based engine.

In Example 9, the subject matter of Example 8 includes, wherein the hardware-based engines are controlled by hardware-executable program instructions.

In Example 10, the subject matter of Examples 1-9 includes, wherein the term extractor produces an extracted-term data structure as its output, and wherein the statement differentiator uses the extracted-term data structure as its input.

In Example 11, the subject matter of Examples 1-10 includes, wherein the statement differentiator is to produce a segmented data structure comprising distinctly-identifiable individual ones of the segments.

In Example 12, the subject matter of Examples 1-11 includes, wherein the statement differentiator is to delineate the textual content of each MBSE work into segments corresponding to separately identifiable textual statements of that MBSE work according to relative placement of those textual statements within that MBSE work.

In Example 13, the subject matter of Examples 1-12 includes, wherein the statement differentiator is to delineate the textual content of each MBSE work into segments corresponding to separately identifiable textual statements of that MBSE work according to headings or subheadings dividing those textual statements.

In Example 14, the subject matter of Examples 1-13 includes, wherein the statement differentiator is to delineate the textual content of each MBSE work into segments corresponding to separately identifiable textual statements of that MBSE work according to punctuation symbols dividing those textual statements.

In Example 15, the subject matter of Examples 1-14 includes, wherein the statement differentiator is to delineate the textual content of each MBSE work into segments corresponding to separately identifiable textual statements of that MBSE work according to MBSE work type-specific statement-differentiation criteria, wherein the MBSE work type-specific statement-differentiation criteria differs according to a type of MBSE work to which the MBSE work type-specific statement-differentiation criteria is to be applied.

In Example 16, the subject matter of Examples 1-15 includes, wherein the segment comparison result includes a numerical comparison score.

In Example 17, the subject matter of Examples 1-16 includes, wherein the linkage generator is to determine statement-wise linkages between statements of the first MBSE work and the second MBSE work based on a linkage determination comparison of each of the statement-wise comparison results against a linkage-generation threshold, wherein a linkage is generated in response to the linkage determination comparison exceeding the linkage-generation threshold.

In Example 18, the subject matter of Examples 1-17 includes, wherein the linkage set data structure identifies each segment of each of the first and the second MBSE works, and lists other segments of other MBSE works with which linkages have been created.

In Example 19, the subject matter of Examples 1-18 includes, wherein the linkage set data structure is distributed as a set of data structures respectively associated with different ones of the MBSE works.

In Example 20, the subject matter of Examples 1-19 includes, wherein the content of the first MBSE work is primarily graphical in nature and the content of the second MBSE work is primarily textual in nature, and wherein textual content of the first MBSE work is sparser than textual content of the second MBSE work.

In Example 21, the subject matter of Examples 1-20 includes, a linkage overlap detector to access the linkage set data structure, and to compare the statement-wise linkages associated with each statement of a given MBSE work against the statement-wise linkages associated with every other statement within the given MBSE work to produce an intra-work linkage comparison result.

In Example 22, the subject matter of Example 21 includes, wherein the linkage overlap detector engine is to compare the intra-work linkage comparison result against overlap assessment criteria to determine whether any two or more statements within the given MBSE work have the same or similar linkages to statements of other MBSE works.

In Example 23, the subject matter of Example 22 includes, wherein the linkage overlap detector engine is to autonomously combine two or more statements within the given MBSE work that have the same or similar linkages to statements of other MBSE works in response to satisfaction of the overlap assessment criteria.

In Example 24, the subject matter of Examples 1-23 includes, a linkage gap detector to access the linkage set data structure, and to autonomously compare the statement-wise linkages associated with each statement of the first and the second MBSE works against linkage gap assessment criteria to determine whether the linkage set data structure is missing any expected linkages.

Example 25 is an automated method for determination of linkages across disparate works in a model-based system engineering (MBSE) regime, the method being carried out by computing hardware, and comprising: accessing textual content of a first MBSE work and textual content of a second MBSE work, wherein the textual content of each MBSE work includes, a plurality of textual statements, and wherein the textual content of the first MBSE work is structurally, grammatically, and quantitatively diverse from the textual content of the second MBSE work; preprocessing each MBSE work to produce a first preprocessed data structure representing the first MBSE work and a second preprocessed data structure representing the second MBSE work, wherein the preprocessing comprises: gathering significant terms from the textual content of each MBSE work, wherein the significant terms include terms of the textual content of each MBSE work that differentiate individual statements from among other statements of the same MBSE work, and omit terms that are distributed throughout that MBSE work; and delineating the textual content of each MBSE work into segments corresponding to separately identifiable textual statements of that MBSE work; performing a segment-wise comparison between segment pairings of the first preprocessed data structure and the second preprocessed data structure to produce a set of segment-wise comparison results based on terms common to each segment pairing; and determining statement-wise linkages between statements of the first MBSE work and the second MBSE work based on the set of segment-wise comparison results, and store the statement-wise linkages as a linkage set data structure.

In Example 26, the subject matter of Example 25 includes, wherein the preprocessing further comprises: normalizing the significant terms of each MBSE work to remove any repeated instances of terms occurring within each segment such that only a single instance of any of the repeated instances remains in each corresponding segment.

In Example 27, the subject matter of Example 26 includes, wherein the normalizing is to further standardize any grammatical inflections among the significant terms of each MBSE work.

In Example 28, the subject matter of Examples 26-27 includes, wherein the normalizing is to add a weighting indicator to each single instance of any removed repeated instances of the terms appearing within each segment, wherein the weighting indicator indicates a degree of prevalence of each single instance.

In Example 29, the subject matter of Examples 27-28 includes, wherein the degree of prevalence is based on a ratio of a quantity of repeated instances of each repeated term within the corresponding segment prior to removal of those repeated instances, to a total quantity of words in that segment.

In Example 30, the subject matter of Examples 26-29 includes, wherein the preprocessing further includes: adding an expanded term set for each of the significant terms that includes the normalized significant terms and terms that are synonymous with the significant terms to each corresponding preprocessed data structure.

In Example 31, the subject matter of Examples 25-30 includes, wherein the delineating the textual content of each MBSE work into segments is to produce a segmented data structure comprising distinctly-identifiable individual ones of the segments.

In Example 32, the subject matter of Examples 25-31 includes, wherein the delineating the textual content of each MBSE work into segments is to delineate the textual content of each MBSE work into segments corresponding to separately identifiable textual statements of that MBSE work according to relative placement of those textual statements within that MBSE work.

In Example 33, the subject matter of Examples 25-32 includes, wherein the delineating the textual content of each MBSE work into segments is to delineate the textual content of each MBSE work into segments corresponding to separately identifiable textual statements of that MBSE work according to headings or subheadings dividing those textual statements.

In Example 34, the subject matter of Examples 25-33 includes, wherein the delineating the textual content of each MBSE work into segments is to delineate the textual content of each MBSE work into segments corresponding to separately identifiable textual statements of that MBSE work according to punctuation symbols dividing those textual statements.

In Example 35, the subject matter of Examples 25-34 includes, wherein the delineating the textual content of each MBSE work into segments is to delineate the textual content of each MBSE work into segments corresponding to separately identifiable textual statements of that MBSE work according to MBSE work type-specific statement-differentiation criteria, wherein the MBSE work type-specific statement-differentiation criteria differs according to a type of MBSE work to which the MBSE work type-specific statement-differentiation criteria is to be applied.

In Example 36, the subject matter of Examples 25-35 includes, wherein the segment comparison result includes a numerical comparison score.

In Example 37, the subject matter of Examples 25-36 includes, wherein determining statement-wise linkages includes determining statement-wise linkages between statements of the first MBSE work and the second MBSE work based on a linkage determination comparison of each of the statement-wise comparison results against a linkage-generation threshold, wherein a linkage is generated in response to the linkage determination comparison exceeding the linkage-generation threshold.

In Example 38, the subject matter of Examples 25-37 includes, wherein the linkage set data structure identifies each segment of each of the first and the second MBSE works, and lists other segments of other MBSE works with which linkages have been created.

In Example 39, the subject matter of Examples 25-38 includes, wherein the linkage set data structure is distributed as a set of data structures respectively associated with different ones of the MBSE works.

In Example 40, the subject matter of Examples 25-39 includes, wherein the content of the first MBSE work is primarily graphical in nature and the content of the second MBSE work is primarily textual in nature, and wherein textual content of the first MBSE work is sparser than textual content of the second MBSE work.

In Example 41, the subject matter of Examples 25-40 includes, accessing the linkage set data structure, and comparing the statement-wise linkages associated with each statement of a given MBSE work against the statement-wise linkages associated with every other statement within the given MBSE work to produce an intra-work linkage comparison result.

In Example 42, the subject matter of Example 41 includes, wherein comparing the statement-wise linkages associated with each statement of a given MBSE work against the statement-wise linkages associated with every other statement within the given MBSE work includes comparing the intra-work linkage comparison result against overlap assessment criteria to determine whether any two or more statements within the given MBSE work have the same or similar linkages to statements of other MBSE works.

In Example 43, the subject matter of Example 42 includes, wherein comparing the statement-wise linkages associated with each statement of a given MBSE work against the statement-wise linkages associated with every other statement within the given MBSE work includes combining two or more statements within the given MBSE work that have the same or similar linkages to statements of other MBSE works in response to satisfaction of the overlap assessment criteria.

In Example 44, the subject matter of Examples 25-43 includes, accessing the linkage set data structure, and comparing the statement-wise linkages associated with each statement of the first and the second MBSE works against linkage gap assessment criteria to determine whether the linkage set data structure is missing any expected linkages.

Example 45 is at least one non-transitory machine-readable medium containing instructions that, when executed on a computing platform, cause the computing platform to perform determination of linkages across disparate works in a model-based system engineering (MBSE) regime, including: accessing textual content of a first MBSE work and textual content of a second MBSE work, wherein the textual content of each MBSE work includes, a plurality of textual statements, and wherein the textual content of the first MBSE work is structurally, grammatically, and quantitatively diverse from the textual content of the second MBSE work; preprocessing each MBSE work to produce a first preprocessed data structure representing the first MBSE work and a second preprocessed data structure representing the second MBSE work, wherein the preprocessing comprises: gathering significant terms from the textual content of each MBSE work, wherein the significant terms include terms of the textual content of each MBSE work that differentiate individual statements from among other statements of the same MBSE work, and omit terms that are distributed throughout that MBSE work; and delineating the textual content of each MBSE work into segments corresponding to separately identifiable textual statements of that MBSE work; performing a segment-wise comparison between segment pairings of the first preprocessed data structure and the second preprocessed data structure to produce a set of segment-wise comparison results based on terms common to each segment pairing; and determining statement-wise linkages between statements of the first MBSE work and the second MBSE work based on the set of segment-wise comparison results, and store the statement-wise linkages as a linkage set data structure.

In Example 46, the subject matter of Example 45 includes, wherein the instructions to perform the preprocessing further comprise: instructions for normalizing the significant terms of each MBSE work to remove any repeated instances of terms occurring within each segment such that only a single instance of any of the repeated instances remains in each corresponding segment.

In Example 47, the subject matter of Example 46 includes, wherein the normalizing is to further standardize any grammatical inflections among the significant terms of each MBSE work.

In Example 48, the subject matter of Examples 46-47 includes, wherein the normalizing is to add a weighting indicator to each single instance of any removed repeated instances of the terms appearing within each segment, wherein the weighting indicator indicates a degree of prevalence of each single instance.

In Example 49, the subject matter of Examples 47-48 includes, wherein the degree of prevalence is based on a ratio of a quantity of repeated instances of each repeated term within the corresponding segment prior to removal of those repeated instances, to a total quantity of words in that segment.

In Example 50, the subject matter of Examples 46-49 includes, wherein the instructions for preprocessing further include: instructions for adding an expanded term set for each of the significant terms that includes the normalized significant terms and terms that are synonymous with the significant terms to each corresponding preprocessed data structure.

In Example 51, the subject matter of Examples 45-50 includes, wherein the instructions for delineating the textual content of each MBSE work into segments cause the computing platform to produce a segmented data structure comprising distinctly-identifiable individual ones of the segments.

In Example 52, the subject matter of Examples 45-51 includes, wherein the instructions for delineating the textual content of each MBSE work into segments cause the computing platform to delineate the textual content of each MBSE work into segments corresponding to separately identifiable textual statements of that MBSE work according to relative placement of those textual statements within that MBSE work.

In Example 53, the subject matter of Examples 45-52 includes, wherein the instructions for delineating the textual content of each MBSE work into segments cause the computing platform to delineate the textual content of each MBSE work into segments corresponding to separately identifiable textual statements of that MBSE work according to headings or subheadings dividing those textual statements.

In Example 54, the subject matter of Examples 45-53 includes, wherein the instructions for delineating the textual content of each MBSE work into segments cause the computing platform to delineate the textual content of each MBSE work into segments corresponding to separately identifiable textual statements of that MBSE work according to punctuation symbols dividing those textual statements.

In Example 55, the subject matter of Examples 45-54 includes, wherein the instructions for delineating the textual content of each MBSE work into segments cause the computing platform to delineate the textual content of each MBSE work into segments corresponding to separately identifiable textual statements of that MBSE work according to MBSE work type-specific statement-differentiation criteria, wherein the MBSE work type-specific statement-differentiation criteria differs according to a type of MBSE work to which the MBSE work type-specific statement-differentiation criteria is to be applied.

In Example 56, the subject matter of Examples 45-55 includes, wherein the segment comparison result includes a numerical comparison score.

In Example 57, the subject matter of Examples 45-56 includes, wherein the instructions for determining statement-wise linkages include instructions for determining statement-wise linkages between statements of the first MBSE work and the second MBSE work based on a linkage determination comparison of each of the statement-wise comparison results against a linkage-generation threshold, wherein a linkage is generated in response to the linkage determination comparison exceeding the linkage-generation threshold.

In Example 58, the subject matter of Examples 45-57 includes, wherein the linkage set data structure identities each segment of each of the first and the second MBSE works, and lists other segments of other MBSE works with which linkages have been created.

In Example 59, the subject matter of Examples 45-58 includes, wherein the linkage set data structure is distributed as a set of data structures respectively associated with different ones of the MBSE works.

In Example 60, the subject matter of Examples 45-59 includes, wherein the content of the first MBSE work is primarily graphical in nature and the content of the second MBSE work is primarily textual in nature, and wherein textual content of the first MBSE work is sparser than textual content of the second MBSE work.

In Example 61, the subject matter of Examples 45-60 includes, instructions for accessing the linkage set data structure, and comparing the statement-wise linkages associated with each statement of a given MBSE work against the statement-wise linkages associated with every other statement within the given MBSE work to produce an intra-work linkage comparison result.

In Example 62, the subject matter of Example 61 includes, wherein the instructions for comparing the statement-wise linkages associated with each statement of a given MBSE work against the statement-wise linkages associated with every other statement within the given MBSE work include instructions for comparing the intra-work linkage comparison result against overlap assessment criteria to determine whether any two or more statements within the given MBSE work have the same or similar linkages to statements of other MBSE works.

In Example 63, the subject matter of Example 62 includes, wherein the instructions for comparing the statement-wise linkages associated with each statement of a given MBSE work against the statement-wise linkages associated with every other statement within the given MBSE work include instructions for combining two or more statements within the given MBSE work that have the same or similar linkages to statements of other MBSE works in response to satisfaction of the overlap assessment criteria.

In Example 64, the subject matter of Examples 45-63 includes, instructions for accessing the linkage set data structure, and comparing the statement-wise linkages associated with each statement of the first and the second MBSE works against linkage gap assessment criteria to determine whether the linkage set data structure is missing any expected linkages.

Example 65 is an automated system for determination of linkages across disparate works in a model-based system engineering (MBSE) regime, the system comprising: means for accessing textual content of a first MBSE work and textual content of a second. MBSE work, wherein the textual content of each MBSE work includes, a plurality of textual statements, and wherein the textual content of the first MBSE work is structurally, grammatically, and quantitatively diverse from the textual content of the second MBSE work; means for preprocessing each MBSE work to produce a first preprocessed data structure representing the first MBSE work and a second preprocessed data structure representing the second MBSE work, wherein the means for preprocessing comprises: means for gathering significant terms from the textual content of each MBSE work, wherein the significant terms include terms of the textual content of each MBSE work that differentiate individual statements from among other statements of the same MBSE work, and omit terms that are distributed throughout that MBSE work; and means for delineating the textual content of each MBSE work into segments corresponding to separately identifiable textual statements of that MBSE work; means for performing a segment-wise comparison between segment pairings of the first preprocessed data structure and the second preprocessed data structure to produce a set of segment-wise comparison results based on terms common to each segment pairing; and means for determining statement-wise linkages between statements of the first MBSE work and the second MBSE work based on the set of segment-wise comparison results, and store the statement-wise linkages as a linkage set data structure.

In Example 66, the subject matter of Example 65 includes, wherein the means for preprocessing further comprises: means for normalizing the significant terms of each MBSE work to remove any repeated instances of terms occurring within each segment such that only a single instance of any of the repeated instances remains in each corresponding segment.

In Example 67, the subject matter of Example 66 includes, wherein the means for normalizing is to further standardize any grammatical inflections among the significant terms of each MBSE work.

In Example 68, the subject matter of Examples 66-67 includes, wherein the means for normalizing is to add a weighting indicator to each single instance of any removed repeated instances of the terms appearing within each segment, wherein the weighting indicator indicates a degree of prevalence of each single instance.

In Example 69, the subject matter of Examples 67-68 includes, wherein the degree of prevalence is based on a ratio of a quantity of repeated instances of each repeated term within the corresponding segment prior to removal of those repeated instances, to a total quantity of words in that segment.

In Example 70, the subject matter of Examples 66-69 includes, wherein the means for preprocessing further includes: means for adding an expanded term set for each of the significant terms that includes the normalized significant terms and terms that are synonymous with the significant terms to each corresponding preprocessed data structure.

In Example 71, the subject matter of Examples 65-70 includes, wherein the means for delineating the textual content of each MBSE work into segments is to produce a segmented data structure comprising distinctly-identifiable individual ones of the segments.

In Example 72, the subject matter of Examples 65-71 includes, wherein the means for delineating the textual content of each MBSE work into segments is to delineate the textual content of each MBSE work into segments corresponding to separately identifiable textual statements of that MBSE work according to relative placement of those textual statements within that MBSE work.

In Example 73, the subject matter of Examples 65-72 includes, wherein the means for delineating the textual content of each MBSE work into segments is to delineate the textual content of each MBSE work into segments corresponding to separately identifiable textual statements of that MBSE work according to headings or subheadings dividing those textual statements.

In Example 74, the subject matter of Examples 65-73 includes, wherein the means for delineating the textual content of each MBSE work into segments is to delineate the textual content of each MBSE work into segments corresponding to separately identifiable textual statements of that MBSE work according to punctuation symbols dividing those textual statements.

In Example 75, the subject matter of Examples 65-74 includes, wherein the means for delineating the textual content of each MBSE work into segments is to delineate the textual content of each MBSE work into segments corresponding to separately identifiable textual statements of that MBSE work according to MBSE work type-specific statement-differentiation criteria, wherein the MBSE work type-specific statement-differentiation criteria differs according to a type of MBSE work to which the MBSE work type-specific statement-differentiation criteria is to be applied.

In Example 76, the subject matter of Examples 65-75 includes, wherein the segment comparison result includes a numerical comparison score.

In Example 77, the subject matter of Examples 65-76 includes, wherein means for determining statement-wise linkages includes determining statement-wise linkages between statements of the first MBSE work and the second MBSE work based on a linkage determination comparison of each of the statement-wise comparison results against a linkage-generation threshold, wherein a linkage is generated in response to the linkage determination comparison exceeding the linkage-generation threshold.

In Example 78, the subject matter of Examples 65-77 includes, wherein the linkage set data structure identifies each segment of each of the first and the second MBSE works, and lists other segments of other MBSE works with which linkages have been created.

In Example 79, the subject matter of Examples 65-78 includes, wherein the linkage set data structure is distributed as a set of data structures respectively associated with different ones of the MBSE works.

In Example 80, the subject matter of Examples 65-79 includes, wherein the content of the first MBSE work is primarily graphical in nature and the content of the second MBSE work is primarily textual in nature, and wherein textual content of the first MBSE work is sparser than textual content of the second MBSE work.

In Example 81, the subject matter of Examples 65-80 includes, means for accessing the linkage set data structure, and means for comparing the statement-wise linkages associated with each statement of a given MBSE work against the statement-wise linkages associated with every other statement within the given MBSE work to produce an intra-work linkage comparison result.

In Example 82, the subject matter of Example 81 includes, wherein the means for comparing the statement-wise linkages associated with each statement of a given MBSE work against the statement-wise linkages associated with every other statement within the given MBSE work includes means for comparing the intra-work linkage comparison result against overlap assessment criteria to determine whether any two or more statements within the given MBSE work have the same or similar linkages to statements of other MBSE works.

In Example 83, the subject matter of Example 82 includes, wherein the means for comparing the statement-wise linkages associated with each statement of a given MBSE work against the statement-wise linkages associated with every other statement within the given MBSE work includes means for combining two or more statements within the given MBSE work that have the same or similar linkages to statements of other MBSE works in response to satisfaction of the overlap assessment criteria.

In Example 84, the subject matter of Examples 65-83 includes, means for accessing the linkage set data structure, and means for comparing the statement-wise linkages associated with each statement of the first and the second MBSE works against linkage gap assessment criteria to determine whether the linkage set data structure is missing any expected linkages.

Example 85 is at least one machine-readable medium including instructions that, when executed by processing circuitry, cause the processing circuitry to perform operations to implement of any of Examples 1-84.

Example 86 is an apparatus comprising means to implement of any of Examples 1-84.

Example 87 is a system to implement of any of Examples 1-84.

Example 88 is a method to implement of any of Examples 1-84.

The above detailed description includes references to the accompanying drawings, which form a part of the detailed description. The drawings show, by way of illustration, specific embodiments that may be practiced. These embodiments are also referred to herein as "examples," Such examples may include elements in addition to those shown or described. However, also contemplated are examples that include the elements shown or described. Moreover, also contemplated are examples using any combination or permutation of those elements shown or described (or one or more aspects thereof), either with respect to a particular example (or one or more aspects thereof), or with respect to other examples (or one or more aspects thereof) shown or described herein.

Publications, patents, and patent documents referred to in this document are incorporated by reference herein in their entirety, as though individually incorporated by reference. In the event of inconsistent usages between this document and those documents so incorporated by reference, the usage in the incorporated reference(s) are supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third,"

etc. are used merely as labels, and are not intended to suggest a numerical order for their objects.

The above description is intended to be illustrative, and not restrictive. For example, the above-described examples (or one or more aspects thereof) may be used in combination with others. Other embodiments may be used, such as by one of ordinary skill in the art upon reviewing the above description. The Abstract is to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. However, the claims may not set forth every feature disclosed herein as embodiments may feature a subset of said features. Further, embodiments may include fewer features than those disclosed in a particular example. Thus, the following claims are hereby incorporated into the Detailed Description, with a claim standing on its own as a separate embodiment. The scope of the embodiments disclosed herein is to be determined with reference to the appended claims, along with the full scope of equivalents to which such claims are entitled.

What is claimed is:

1. A computational accelerator system for determination of linkages across disparate works in a model-based system engineering (MBSE) regime, the system comprising:
    a MBSE work interface input to access textual content of a first MBSE work and textual content of a second MBSE work, wherein the textual content of each MBSE work includes a plurality of textual statements, and wherein the textual content of the first MBSE work is structurally, grammatically, and quantitatively diverse from the textual content of the second MBSE work;
    a MBSE work preprocessor communicatively coupled to the MBSE work interface input, and configured to autonomously preprocess each MBSE work to produce a first preprocessed data structure representing the first MBSE work and a second preprocessed data structure representing the second MBSE work, wherein the MBSE work preprocessor comprises:
        a term extractor to gather significant terms from the textual content of each MBSE work, wherein the significant terms include terms of the textual content of each MBSE work that differentiate individual statements from among other statements of the same MBSE work, and omit terms that are distributed throughout that MBSE work; and
        a statement differentiator to delineate the textual content of each MBSE work into segments corresponding to separately identifiable textual statements of that MBSE work;
    a statement comparator to autonomously perform a segment-wise comparison between segment pairings of the first preprocessed data structure and the second preprocessed data structure to produce a set of segment-wise comparison results based on terms common to each segment pairing;
    a linkage generator to autonomously determine statement-wise linkages between statements of the first MBSE work and the second MBSE work based on the set of segment-wise comparison results, and store the statement-wise linkages as a linkage set data structure; and
    a linkage overlap detector to access the linkage set data structure, and to compare the statement-wise linkages associated with each statement of a given MBSE work against the statement-wise linkages associated with every other statement within the given MBSE work to produce an intra-work linkage comparison result.

2. The computational accelerator system of claim 1, wherein the MBSE work preprocessor further comprises:
    a statement normalizer to normalize the significant terms of each MBSE work to remove any repeated instances of terms occurring within each segment such that only a single instance of any of the repeated instances remains in each corresponding segment.

3. The computational accelerator system of claim 2, wherein the MBSE work preprocessor further comprises:
    a term expander to add an expanded term set for each of the significant terms that includes the normalized significant terms and terms that are synonymous with the significant terms to each corresponding preprocessed data structure.

4. The computational accelerator system of claim 1, wherein the statement differentiator is to delineate the textual content of each MBSE work into segments corresponding to separately identifiable textual statements of that MBSE work according to relative placement of those textual statements within that MBSE work.

5. The computational accelerator system of claim 1, wherein the statement differentiator is to delineate the textual content of each MBSE work into segments corresponding to separately identifiable textual statements of that MBSE work according to headings or subheadings dividing those textual statements.

6. The computational accelerator system of claim 1, wherein the statement differentiator is to delineate the textual content of each MBSE work into segments corresponding to separately identifiable textual statements of that MBSE work according to punctuation symbols dividing those textual statements.

7. The computational accelerator system of claim 1, wherein the statement differentiator is to delineate the textual content of each MBSE work into segments corresponding to separately identifiable textual statements of that MBSE work according to MBSE work type-specific statement-differentiation criteria, wherein the MBSE work type-specific statement-differentiation criteria differs according to a type of MBSE work to which the MBSE work type-specific statement-differentiation criteria is to be applied.

8. The computational accelerator system of claim 1, wherein the segment comparison result includes a numerical comparison score.

9. The computational accelerator system of claim 1, wherein the linkage generator is to determine statement-wise linkages between statements of the first MBSE work and the second MBSE work based on a linkage determination comparison of each of the statement-wise comparison results against a linkage-generation threshold, wherein a linkage is generated in response to the linkage determination comparison exceeding the linkage-generation threshold.

10. The computational accelerator system of claim 1, wherein the linkage set data structure identifies each segment of each of the first and the second MBSE works, and lists other segments of other MBSE works with which linkages have been created.

11. The computational accelerator system of claim 1, wherein the linkage set data structure is distributed as a set of data structures respectively associated with different ones of the MBSE works.

12. The computational accelerator system of claim 1, wherein the content of the first MBSE work is primarily graphical in nature and the content of the second MBSE work is primarily textual in nature, and wherein textual content of the first MBSE work is sparser than textual content of the second MBSE work.

13. The computational accelerator system of claim 1, wherein the linkage overlap detector engine is to compare the intra-work linkage comparison result against overlap assessment criteria to determine whether any two or more statements within the given MBSE work have the same or similar linkages to statements of other MBSE works.

14. The computational accelerator system of claim 13, wherein the linkage overlap detector engine is to autonomously combine two or more statements within the given MBSE work that have the same or similar linkages to statements of other MBSE works in response to satisfaction of the overlap assessment criteria.

15. The computational accelerator system of claim 1, further comprising:
a linkage gap detector to access the linkage set data structure, and to autonomously compare the statement-wise linkages associated with each statement of the first and the second MBSE works against linkage gap assessment criteria to determine whether the linkage set data structure is missing any expected linkages.

16. An automated method for determination of linkages across disparate works in a model-based system engineering (MBSE) regime, the method being carried out by computing hardware, and comprising:
accessing textual content of a first MBSE work and textual content of a second MBSE work, wherein the textual content of each MBSE work includes a plurality of textual statements, and wherein the textual content of the first MBSE work is structurally, grammatically, and quantitatively diverse from the textual content of the second MBSE work;
preprocessing each MBSE work to produce a first preprocessed data structure representing the first MBSE work and a second preprocessed data structure representing the second MBSE work, wherein the preprocessing comprises:
gathering significant terms from the textual content of each MBSE work, wherein the significant terms include terms of the textual content of each MBSE work that differentiate individual statements from among other statements of the same MBSE work, and omit terms that are distributed throughout that MBSE work; and
delineating the textual content of each MBSE work into segments corresponding to separately identifiable textual statements of that MBSE work;
performing a segment-wise comparison between segment pairings of the first preprocessed data structure and the second preprocessed data structure to produce a set of segment-wise comparison results based on terms common to each segment pairing;
determining statement-wise linkages between statements of the first MBSE work and the second MBSE work based on the set of segment-wise comparison results, and store the statement-wise linkages as a linkage set data structure; and
accessing the linkage set data structure, and comparing the statement-wise linkages associated with each statement of a given MBSE work against the statement-wise linkages associated with every other statement within the given MBSE work to produce an intra-work linkage comparison result.

17. The method of claim 16, wherein the preprocessing further comprises:
normalizing the significant terms of each MBSE work to remove any repeated instances of terms occurring within each segment such that only a single instance of any of the repeated instances remains in each corresponding segment.

18. The method of claim 17, wherein the preprocessing further includes:
adding an expanded term set for each of the significant terms that includes the normalized significant terms and terms that are synonymous with the significant terms to each corresponding preprocessed data structure.

19. The method of claim 16, wherein determining statement-wise linkages includes determining statement-wise linkages between statements of the first MBSE work and the second MBSE work based on a linkage determination comparison of each of the statement-wise comparison results against a linkage-generation threshold, wherein a linkage is generated in response to the linkage determination comparison exceeding the linkage-generation threshold.

20. The method of claim 16, wherein the content of the first MBSE work is primarily graphical in nature and the content of the second MBSE work is primarily textual in nature, and wherein textual content of the first MBSE work is sparser than textual content of the second MBSE work.

21. The method of claim 16, further comprising:
accessing the linkage set data structure, and comparing the statement-wise linkages associated with each statement of a given MBSE work against the statement-wise linkages associated with every other statement within the given MBSE work to produce an intra-work linkage comparison result.

22. The method of claim 16, further comprising:
accessing the linkage set data structure, and comparing the statement-wise linkages associated with each statement of the first and the second MBSE works against linkage gap assessment criteria to determine whether the linkage set data structure is missing any expected linkages.

23. At least one non-transitory machine-readable medium containing instructions that, when executed on a computing platform, cause the computing platform to perform determination of linkages across disparate works in a model-based system engineering (MBSE) regime, including:
accessing textual content of a first MBSE work and textual content of a second MBSE work, wherein the textual content of each MBSE work includes a plurality of textual statements, and wherein the textual content of the first MBSE work is structurally, grammatically, and quantitatively diverse from the textual content of the second MBSE work,
preprocessing each MBSE work to produce a first preprocessed data structure representing the first MBSE work and a second preprocessed data structure representing the second MBSE work, wherein the preprocessing comprises:
gathering significant terms from the textual content of each MBSE work, wherein the significant terms include terms of the textual content of each MBSE work that differentiate individual statements from among other statements of the same MBSE work, and omit terms that are distributed throughout that MBSE work; and
delineating the textual content of each MBSE work into segments corresponding to separately identifiable textual statements of that MBSE work;
performing a segment-wise comparison between segment pairings of the first preprocessed data structure and the second preprocessed data structure to produce a set of segment-wise comparison results based on terms common to each segment pairing;

determining statement-wise linkages between statements of the first MBSE work and the second MBSE work based on the set of segment-wise comparison results, and store the statement-wise linkages as a linkage set data structure; and accessing the linkage set data structure, and comparing the statement-wise linkages associated with each statement of a given MBSE work against the statement-wise linkages associated with every other statement within the given MBSE work to produce an intra-work linkage comparison result.

24. The at least one non-transitory machine-readable medium of claim 23, wherein the instructions to perform the preprocessing further comprise:

instructions for normalizing the significant terms of each MBSE work to remove any repeated instances of terms occurring within each segment such that only a single instance of any of the repeated instances remains in each corresponding segment.

25. The at least one non-transitory machine-readable medium of claim 24, wherein the instructions for preprocessing further include:

instructions for adding an expanded term set for each of the significant terms that includes the normalized significant terms and terms that are synonymous with the significant terms to each corresponding preprocessed data structure.

26. The at least one non-transitory machine-readable medium of claim 23, wherein the instructions for determining statement-wise linkages include instructions for determining statement-wise linkages between statements of the first MBSE work and the second MBSE work based on a linkage determination comparison of each of the statement-wise comparison results against a linkage-generation threshold, wherein a linkage is generated in response to the linkage determination comparison exceeding the linkage-generation threshold.

27. The at least one non-transitory machine-readable medium of claim 23, wherein the content of the first MBSE work is primarily graphical in nature and the content of the second MBSE work is primarily textual in nature, and wherein textual content of the first MBSE work is sparser than textual content of the second MBSE work.

28. The at least one non-transitory machine-readable medium of claim 23, further comprising:

instructions for accessing the linkage set data structure, and comparing the statement-wise linkages associated with each statement of a given MBSE work against the statement-wise linkages associated with every other statement within the given MBSE work to produce an intra-work linkage comparison result.

29. The at least one non-transitory machine-readable medium of claim 23, further comprising:

instructions for accessing the linkage set data structure, and comparing the statement-wise linkages associated with each statement of the first and the second MBSE works against linkage gap assessment criteria to determine whether the linkage set data structure is missing any expected linkages.

30. A computational accelerator system for facilitating change management of works in a model-based system engineering (MBSE) regime, the system comprising:

a MBSE work interface input to access content of a first MBSE work and content of a second MBSE work;

a MBSE work preprocessor communicatively coupled to the MBSE work interface input, and configured to autonomously preprocess each MBSE work to produce a first preprocessed data structure representing the first MBSE work and a second preprocessed data structure representing the second MBSE work, wherein the MBSE work preprocessor comprises:

a statement differentiator to delineate the respective content of each MBSE work into segments corresponding to separately identifiable statements of that MBSE work; and a statement comparator to autonomously perform a segment-wise comparison between segment pairings of the first preprocessed data structure and the second preprocessed data structure to produce a set of segment-wise comparison results based on content similarity among each segment pairing;

a linkage generator to autonomously determine statement-wise, variable-strength linkages between statements of the first MBSE work and the second MBSE work based on the set of segment-wise comparison results, and store the statement-wise, variable-strength linkages as a linkage set data structure that includes associations between certain statements across the first MBSE work and the second MBSE work, and indicates at least one measure of linkage strength corresponding to the associations; and a linkage overlap detector to access the linkage set data structure, and to compare the statement-wise linkages associated with each statement of a given MBSE work against the statement-wise linkages associated with every other statement within the given MBSE work to produce an intra-work linkage comparison result.

* * * * *

UNITED STATES PATENT AND TRADEMARK OFFICE
CERTIFICATE OF CORRECTION

PATENT NO. : 10,922,446 B2
APPLICATION NO. : 15/845469
DATED : February 16, 2021
INVENTOR(S) : Gottschlich et al.

It is certified that error appears in the above-identified patent and that said Letters Patent is hereby corrected as shown below:

In the Drawings

Sheet 8 of 12, Fig. 7, reference numeral 706, Line 1, delete "MSBE" and insert --MBSE-- therefor Sheet 9 of 12, Fig. 8, reference numeral 810, Line 1, delete "STANDARDIIZE" and insert --STANDARDIZE-- therefor In the Specification Column 1, Line 35, delete "forms," and insert --forms.-- therefor Column 2, Line 51, delete "project." and insert --project,-- therefor Column 2, Line 54, before "product", insert --the--

Column 5, Line 46, before "e.g.,", insert --(--

Column 8, Line 42, before "a database", insert --(e.g.,--

Column 8, Line 61, delete "tile," and insert --file,-- therefor

Column 10, Line 44, before "distributed)", insert --(or--

Column 12, Line 36, delete "initialing" and insert --initiating-- therefor

Column 17, Line 11, delete "MSBE" and insert --MBSE-- therefor

Column 25, Line 66, delete "second." and insert --second-- therefor

Column 28, Line 35, delete ""examples,"" and insert --"examples."-- therefor

Signed and Sealed this
Eighteenth Day of May, 2021

Drew Hirshfeld
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 10,922,446 B2

In the Claims

Column 32, Line 50, Claim 23, delete "work," and insert --work;-- therefor